United States Patent [19]
Tabuchi et al.

[11] Patent Number: 5,757,999
[45] Date of Patent: May 26, 1998

[54] OPTICAL DEVICE

[75] Inventors: Haruhiko Tabuchi; Masami Goto; Masumi Norizuki, all of Kawasaki, Japan

[73] Assignee: Fujitsu Limited, Kanagawa, Japan

[21] Appl. No.: 671,507

[22] Filed: Jun. 27, 1996

[30] Foreign Application Priority Data

Sep. 14, 1995 [JP] Japan .................. 7-236407

[51] Int. Cl.$^6$ .................................................. G02B 6/36
[52] U.S. Cl. .................. 385/93; 385/35; 385/49; 385/65; 385/83
[58] Field of Search .................. 385/49, 88–94, 385/65, 83

[56] References Cited

FOREIGN PATENT DOCUMENTS

| 3809396 | 10/1989 | Germany | 385/93 |
|---|---|---|---|
| 56-46203 | 4/1981 | Japan | 385/93 |
| 63-15908 | 6/1988 | Japan | 385/65 |

OTHER PUBLICATIONS

IEEE Transactions Photonics Technology Letters, vol. 3, No. 11, pp. 985–987, Nov., 1991.

IEEE Transactions on Components, Hybrids, and Manufacturing Technology, vol. 15, No. 2, pp. 225–230, Apr., 1992.

Proceeding of the 1992 IEICE Fall Conference, 4-235.

Proceeding of the 1994 IEICE Spring Conference, 5-21.

Primary Examiner—John Ngo
Attorney, Agent, or Firm—Helfgott & Karas, P.C.

[57] ABSTRACT

An optical device includes a common carrier, a first optical component and a second optical component that are supported by the common carrier, the first optical component being placed on the common carrier. This common carrier includes the following on a main surface thereof. The common carrier includes a first guide groove in which the second optical component is placed, a first beam passing groove extending from a vicinity of the first optical component along an optical axis so that a light beam emitted from the first optical component travels in the beam passing groove. The common carrier includes a second groove which is connected to the first guide groove and the first beam passing groove and extends in a first direction perpendicular to the optical axis, the second groove allowing the light beam to travel at a position lower than the main surface of the common carrier without being shaded.

6 Claims, 49 Drawing Sheets

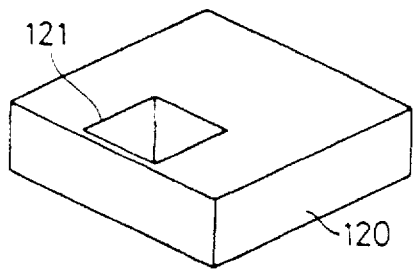
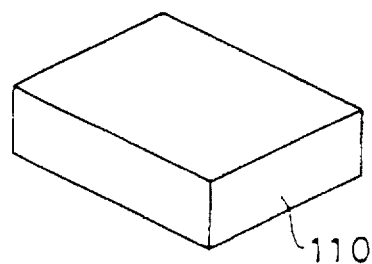
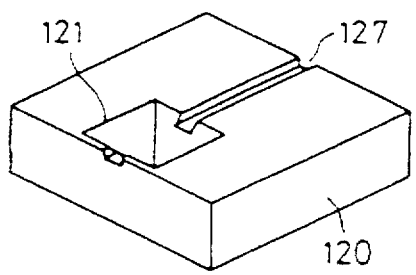
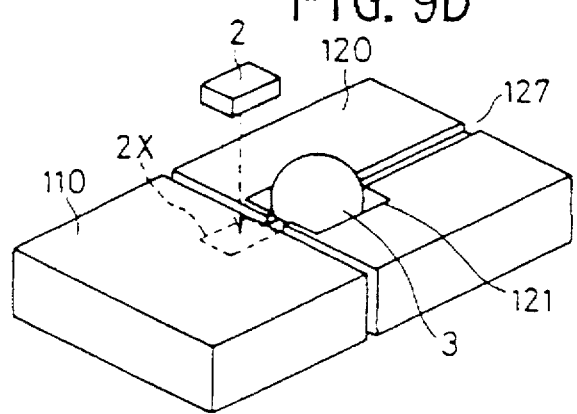

FIG. 18A
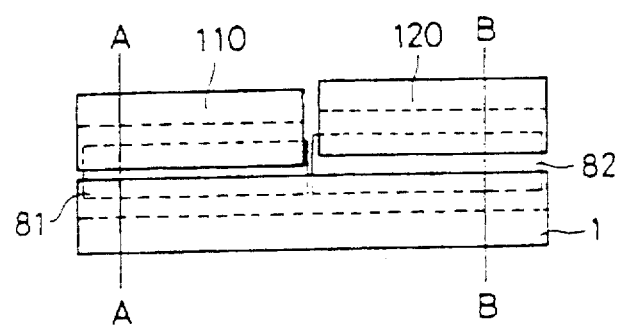
FIG. 18B
FIG. 18C
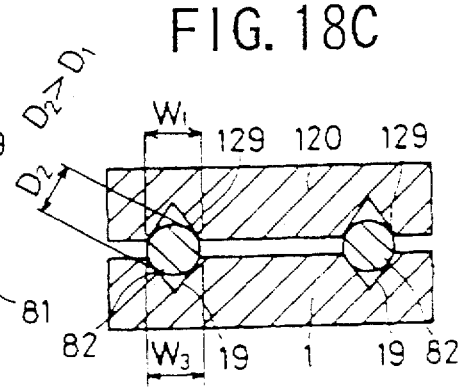

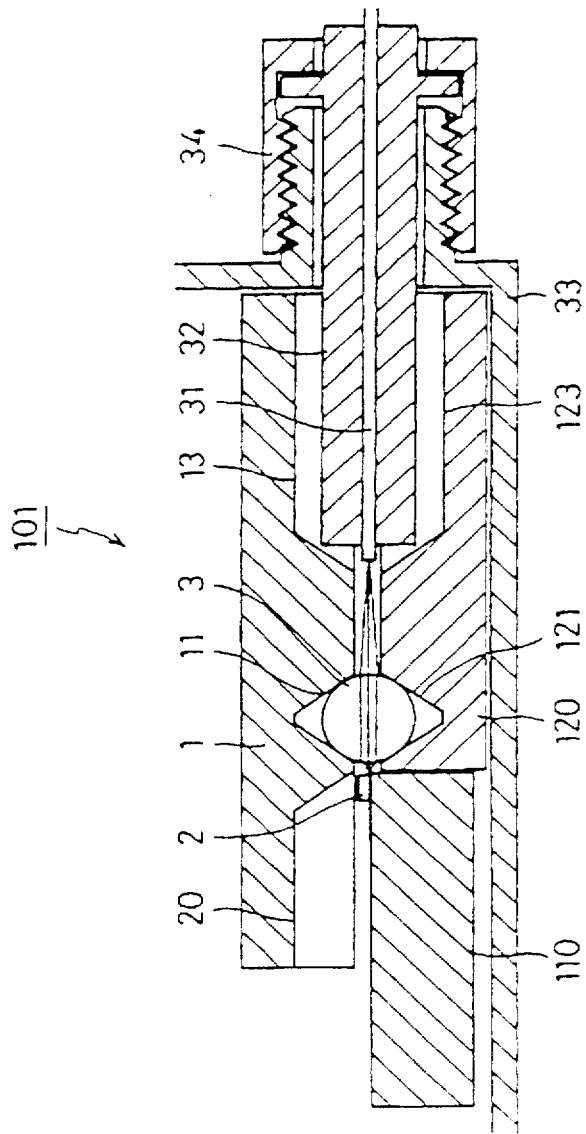

FIG. 39A
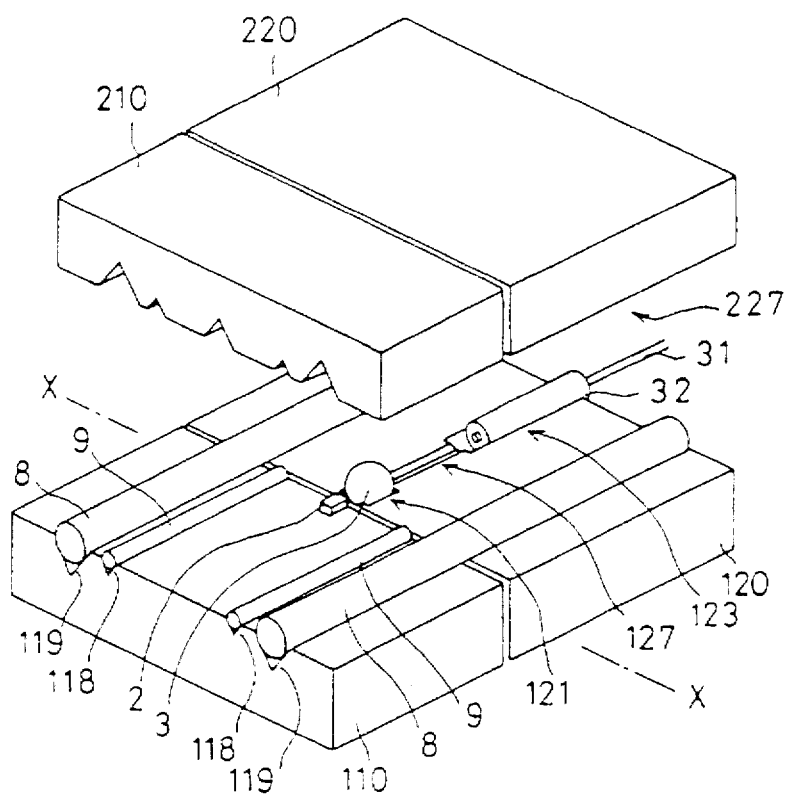
FIG. 39B
FIG. 39C
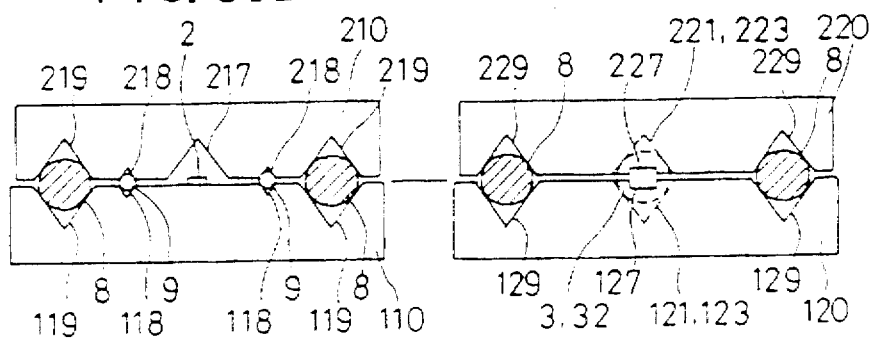

OPTICAL DEVICE

BACKGROUND OF THE INVENTION

1. Field of the Invention

The present invention generally relates to optical devices, and more particularly to an optical device in which optical components are supported by a common supporting member so that the optical components can be mutually positioned.

An optical device is used as a light source of a light communication device. Usually, such an optical device has a plate-shaped supporting member (hereinafter referred to as a carrier) on which a semiconductor laser diode and a lens for coupling a light beam emitted from the laser diode with an optical fiber are mounted. In the above structure, it is necessary to position, on the order of microns, the optical axes of the mutual position of the laser diode, the lens and the optical fiber in the direction parallel to a main surface of the carrier on which these components are provided and to position, on the order of microns, the distance between the optical axes of the components and the main surface of the carrier in the vertical direction, the main surface serving as a reference of positioning of a component in the vertical direction. Hereinafter, the above mutual position in the direction parallel to the main surface of the carrier is referred to as a transverse position. Further, the above distance between the optical axis and the main surface of the carrier (reference surface) in the vertical direction is referred to as an optical-axis-height.

It will be noted that the smallest possible distance between the main surface of the carrier and the optical axis of the laser diode is quite different from the smallest possible distance between the main surface of the carrier and the optical axis of the lens. Hereinafter, the smallest possible distance between the main surface of the carrier and the optical axis of the component is referred to as an optical-axis/carrier distance.

It is required to provide a technique capable of precisely adjusting the transverse positions and the optical-axis-heights of two or more optical components having different optical-axis/carrier distances.

2. Description of Related Art

The lens interposed between the laser diode and the optical fiber fixed to the carrier provides a high efficiency in an optical coupling. Usually, the laser diode has a relatively small size and an optical axis is located at a lower portion thereof, and thus has an extremely small optical-axis/carrier distance. The lens functions to enlarge the spot size of the laser beam emitted from the laser diode, and is thus needed to have a large optical-axis/carrier distance. More strictly, the lens is needed to have an optical-axis/carrier distance greater than the maximum radius of the beam spot of the laser beam.

There are some known structures for adjusting both the transverse positions and the optical-axis-heights of two components having different optical-axis/carrier distances.

FIGS. 1A and 1B are diagrams of a first conventional optical device having an adjusting structure as described above. More particularly, FIG. 1A is a perspective view of the overall structure of the first conventional optical device, and FIG. 1B is a diagram showing an alignment of a semiconductor laser diode chip and a lens, which are mounted on a carrier.

The optical device shown in FIGS. 1A and 1B has a carrier 1 made of silicon having a guide groove 11 for guiding a lens 3 of a spherical shape. The lens 3 is fixed to the carrier 1. A semiconductor laser diode chip 2 is fixed on the main surface of the carrier 1 by using means for precisely positioning the chip 2. The carrier 1 serves as a common carrier on which the diode chip 2 and the lens 3 are mounted. In FIG. 1B, reference number 26 indicates a laser beam emitted from the chip 2, and reference number 4 indicates a light shaded portion. As the optical-axis-height is small for the optical system shown in FIG. 1B, the laser beam is shaded by the main surface of the carrier 1.

FIGS. 2A and 2B show a second conventional optical device which uses a plate-shaped spacer 5 for adjusting the height of the optical axis of the semiconductor laser diode chip 2. More particularly, FIG. 2A is a perspective view of the overall structure of the optical device, and FIG. 2B is a diagram showing an alignment of the semiconductor laser diode chip 2 and the lens 3 mounted on the carrier 1. The spacer 5 is provided on the lower surface of the chip 2 in order to increase the optical-axis height of the diode chip 2 (the height of the optical axis thereof with respect to the main surface of the carrier 1). Hence, it is possible to eliminate the light shaded portion 4 shown in FIG. 1b.

FIG. 3 is a perspective view of a third conventional optical device in which a groove 17 is provided in the main surface of the carrier 1 so that the laser beam goes along the groove 17. The groove 17 can be formed by a laser ablation process of a laser beam 6. The laser diode chip 2 is placed on an area 16 on the main surface of the carrier 1. The laser ablation process is to project the laser beam 6 onto the main surface of the carrier 1, so that silicon atoms of the carrier 1 is evaporated to thereby obtain a groove having a desired shape. The laser ablation process is described in, for example, Proceeding of the 1994 IEICE (Institute of Electronics, Information and Communication Engineers) Spring Conference, 5–21.

However, the above first through third conventional optical devices have the following respective problems. The first optical device has a disadvantage in that the laser beam emitted from the diode chip 2 is partially shaded. This disadvantage is encountered in any of the following methods for mounting the diode chip 2 on the main surface of the carrier 1. In short, any of the following methods cannot provide a sufficient optical-axis/carrier distance. Thus, the laser beam is shaded.

FIGS. 4A and 4B show a first conventional method of mounting the diode chip 2 on the carrier 1. In the method show in FIG. 4A, dome-shaped projections 22 are provided on pads 21 formed on the lower surface of the chip 2, and grooves 12 are formed on the main surface of the carrier 1. The projections 22 are engaged with the grooves 12, so that the chip 2 can be placed in position. The method shown in FIG. 4A is described in Japanese Laid-Open Patent Application No. 7-159141.

The method shown FIG. 4B uses markers 14 formed on the main surface of the carrier 1. Markers 24 are provided on the lower surface of the chip 2. When mounting the chip 2, the markers 24 are placed on the markers 14. In this state, melting members 23 for bonding provided on the pads 21 are melted and bonded. This method is described in IEEE Transactions Photonics Technology Letters, Vol. 3, No. 11, pp. 985–987, Nov., 1991.

FIGS. 5A, 5B and 5C show a second conventional method of mounting the chip 2 on the carrier 1. The second method uses a melting member for bonding, and the chip 2 is positioned on the carrier 1 due to the function of surface tension occurring when the melting member is liquefied. More particularly, FIG. 5A shows a state in which the chip 2 is placed on the carrier 1 at a position deviated from the target position and melting members 23 for bonding have not yet melted. FIG. 5B shows a state in which the melting members 23 for bonding are melted and just fits with a pattern 15 on the carrier 1. FIG. 5C shows a state in which the melting members 23 have melted and the chip 2 is moved in the direction indicated by the arrow shown in FIG. 5B due to surface tension thereof, so that the chip 2 is automatically positioned (which can be called a self-alignment function).

In the second method shown in FIGS. 5A–5C, the melting members 23 are deformed so that the potential of surface tension of the melting members 23 in the liquefied state is minimized. As a result of deformation, the pads 21 of the chip 2 are automatically aligned to the pattern 15 formed on the carrier 1. The chip 2 can be fixed to the carrier 1 by cooling the melting members 23 in the self-aligned state shown in FIG. 5C. In this manner, it is possible to simultaneously make electrical connections and mechanical fixing. The second method shown in FIGS. 5A–5C is described in IEEE Transactions on Components, Hybrids, and Manufacturing Technology, Vol. 15, No. 2, pp. 225–230, Apr., 1992 or Proceeding of the 1994 IEICE Spring Conference, 5-21.

FIG. 6 is a perspective view of a third conventional optical device, in which the chip 2 is engaged with a chip engagement groove formed on the main surface of the carrier 1. More particularly, a reference number 28 indicates the above chip engagement groove, which is relatively shallow. A projection 27 is formed by etching the crystal of the surface of the chip 2. The projection 27 is engaged with the chip engagement groove 28. The third method is described in Japanese Laid-Open Patent Application No. 6-38863.

In the first through third methods, it is preferable that face-down bonding be performed in order to increase the precision of positioning the chip 2 at the time of bonding. That is, the pads 21 are formed on the side on which the light-emitting portion is formed. The bonding is carried out so that the pads 21 face down. The face-down bonding makes it possible to obtain a distance between the light-emitting portion and the main surface of the carrier 1 equal to or less than the order of microns (more particularly, equal to or less than, for example, 5 μm). Hence, in the structures shown in FIGS. 4B and 6, the optical-axis/carrier distance of the chip 2 is equal to or less than 5μm. The structures shown in FIGS. 4A and 5A–5C can provide an optical-axis/carrier distance of the chip greater than that obtained in the structures shown in FIGS. 4B and 6, but that distance is also insufficient.

The above fact is due to the following two reasons. The first reason is as follows. The size of the chip 2 is as small as approximately 200 μm×300 μm. Hence, it is difficult to obtain the diameters of the projection 22 and the melting members 23 over approximately 50 μm. More particularly, it is difficult to obtain an optical-axis/carrier distance of the chip 2 equal to or greater than 50–60 μm. The second reason is that the melting members 23 for bonding having a relatively small size are used in order to improve the self-alignment effect in the case shown in FIGS. 5A, 5B and 5C. In practice, the melting members 23 have a diameter of 50 μm or less, and the distance between the optical axis of the chip 2 and the main surface of the carrier 1 is further restricted to a smaller value.

The second reason will further be described in more detail with reference to FIGS. 7A, 7B and 7C, which respectively show factors relating to the optical-axis/carrier distances in the structures shown in FIGS. 4A, 4B and 5A–5C.

Referring to FIG. 7C, the height $h_1$ of the melting members 23 is 50 μm when the pads 21 have a diameter of 50 μm and an angle a is 45°. The optical-axis height $h_2$ is equal to the sum of the height $h_1$, the thicknesses of the pads 15 and 21 and the distance between the lower surface of the chip 2 and the light-emitting portion 25. The distance $h_2$ shown in FIG. 7C is approximately equal to 55 μm. This value corresponds to the maximum value in theory. However, in practice, it is necessary to use a value of the height $h_2$ smaller than 55 μm when taking into consideration the production process.

This is because adjacent melting members 23 for bonding may touch each other when the chip 2 has a width of 200 μm and the pads 21 have a diameter of 50 μm. With the above in mind, it is necessary to use the pads 21 having a diameter less than 50 μm. As has been described previously, it is desirable that the diameter of the pads 21 be as small as possible in order to improve the self-alignment effect. In practice, the distance between the optical axis and the main surface of the carrier 1 is approximately 30 μm.

The structure shown in FIG. 4A has the projection 22 engaged with the groove 12, and thus the distance between the optical axis and the main surface of the carrier 1 thereof is less than that of the structure shown in FIGS. 5A through 5C. The structure shown in FIG. 4B has a distance between the optical axis and the carrier main surface less than that of the structure shown in FIG. 4A.

As described above, when attempting to position the laser diode chip 2 with a high precision, the distance between the optical axis and the main surface of the carrier becomes small. Hence, as shown in FIG. 1B, the laser beams 26 emitted from the laser diode are shaded on the main surface of the carrier 1, so that the light shaded portion 4 appears.

In the structure shown in FIGS. 2A and 2B in which the spacer 5 is used, it is necessary to provide the step of mounting the chip 2 on the spacer 5 and the step of mounting the spacer 5 on the main surface of the carrier 1. If the method shown in FIGS. 4A and 4B is applied to the above steps, it will be necessary to precisely position the pattern provided on the main (upper) surface of the spacer 5 and the pattern provided on the back (lower) surface of the spacer 5. However, it is very difficult to precisely position the patterns even by using photolithograph technology. In practice, a deviation approximately equal to 5 μm will occur. Further, it is necessary for the plate-shaped spacer 5 to have a thickness precision equal to or less than 1 μm. Hence, it is difficult to produce the structure shown in FIGS. 2A and 2B so as to satisfy the above thickness precision.

The third conventional method shown in FIG. 3 has the following problem. When the groove 17 is formed by the laser beam 6 that is continuously projected onto the carrier 1, the laser beam 6 is projected onto oblique wall surfaces 11 which are formed on the main surface of the carrier 1 and guide the lens 3. In this case, the oblique wall surfaces 11 may be cut. In order to avoid this problem, it is necessary to stop projecting the laser beam 6 at the moment the laser beam 6 comes to the oblique wall surfaces 11. However, it is very difficult to control the timing at which the projection of the laser beam 6 is stopped. Further, it is necessary to continuously project the laser beam 6. If the laser beam 6 has a small amount of power, it is necessary to project the laser beam 6 onto the same portion a number of times in order to obtain the groove 17 having a desired depth. In this case, it takes a long time to complete the formation of the groove 17.

SUMMARY OF THE INVENTION

It is a general object of the present invention to provide an optical device in which the above disadvantages are eliminated.

A more specific invention of the present invention is to provide an optical device in which optical components can be precisely positioned on a carrier in the transverse and vertical directions without shading a laser beam.

The above objects of the present invention are achieved by an optical device comprising: a common carrier (1); and a first optical component (2) and a second optical component (3) that are supported by the common carrier, the first optical component being placed on the common carrier. The common carrier comprises on a main surface thereof: a first guide groove (11) in which the second optical component is placed; a first beam passing groove (17) extending from a vicinity of the first guide groove along an optical axis so that a light beam emitted from the first optical component travels in the beam passing groove; and a second groove (18) which is connected to the first guide groove and the first beam passing groove and extends in a first direction perpendicular to the optical axis, the second groove allowing the light beam to travel at a position lower than the main surface of the common carrier without being shaded.

The common carrier may comprise: a second beam passing groove (171) which is located between the first and second optical components (2, 3), the light beam traveling in the second beam passing groove along optical axis; and a third groove (182) which is connected to the first guide groove (11) and the second beam passing groove (171) and extends in the first direction, the third groove (182) allowing the light beam to travel toward the second optical component at a position lower than the main surface of the common carrier without being shaded.

The common carrier (1) may comprise a silicon carrier; the first and second beam passing grooves (17, 171) and the first guide groove (11) may be grooves formed by anisotropically etching the silicon carrier; and the second and third grooves (18, 182) may be grooves formed by a mechanical abrasion process.

The optical component may be configured as follows. The first optical component (2) is a semiconductor laser diode chip; the second optical component (3) is a lens; and the first and second optical components (2, 3) are arranged so that optical axes thereof are aligned.

The above objects of the present invention are also achieved by an optical device comprising: a first carrier (110, 100); a second carrier (120, 200); a first optical component (2) mounted on the first carrier; and a second optical component (3) mounted on the second carrier. The first and second carriers are relatively arranged so that optical axes of the first and second optical components are aligned so as to form a space passing a light beam from the first optical component without being shaded.

The first and second carriers (110, 120) may be arranged side by side.

Alternatively, the first and second carriers (100, 200) may be stacked so that the first and second optical components (2, 3) face each other.

One of the first and second carriers may comprise a beam passing groove (127, 107, 207) in which the beam from the first optical component (2) travels.

The optical device may further comprise a common carrier (1) on which the first and second carriers (110, 120) are placed side by side, and engagement members (8, 81, 82, 8A, 81A, 82A), wherein: the common carrier comprises at least two first positioning grooves (19, 191, 192); the first carrier comprises at least two second positioning grooves (119, 119A); the second carrier comprises at least two third positioning grooves (129, 129A); the engagement members are sandwiched between the at least two first positioning grooves and the at least two second positioning grooves and between the at least two first positioning grooves and the at least two third positioning grooves.

The common carrier (1) may have a first guiding groove (11) in which the second optical component (3) is placed. The second carrier may have a second guiding groove (121) in which the second optical component (3) is placed.

The second positioning grooves (119, 119A) formed on the first carrier (110) may have a width different from that of the third positioning grooves (129, 129A) formed on the second carrier (120), so that the first and second carriers (110, 120) have different heights on the common carrier (1) whereby optical axes of the first and second components (2, 3) are aligned.

The engagement members may comprise first engagement members (8A, 81, 81A) and second engagement members (8A, 82, 82A); the first engagement members may be sandwiched between the at least two first positioning grooves (19, 191) and the at least two second positioning grooves (119, 119A); and the second engagement members may be sandwiched between the at least two first positioning grooves and the at least two third positioning grooves.

The first and second engagement members (8A, 81, 82) may have an identical size; the at least two second positioning grooves (119, 119A) may have a size different from that of the at least two third positioning grooves (129, 129A), so that the first and second carriers (110, 120) have different heights on the common carrier whereby optical axes of the first and second components (2, 3) are aligned.

The first engagement members (81, 81A) may have a size different from that of the second engagement members (82, 82A), so that the first and second carriers (110, 120) have different heights on the common carrier (1) whereby optical axes of the first and second components (2, 3) are aligned.

The first engagement members (8, 81) may be cylindrical members, and the second engagement members (8, 82) may be cylindrical members.

The first engagement members (8A, 81A) may be spherical members, and the second engagement members (8A, 82A) may be spherical members.

The optical device may further comprise at least three spherical-shaped engagement members (8A). The first carrier (100) comprises at least three second positioning grooves (19A). The second carrier (200) comprises at least three third positioning grooves (209). The engagement members (8A) are sandwiched between the second positioning grooves (19A) and the third positioning grooves (209).

The first positioning grooves (19) may be arranged parallel to each other at a first pitch; the second positioning grooves (119) may be arranged parallel to each other at the first pitch; and third positioning grooves (129) may be arranged parallel to each other at the first pitch.

The first positioning grooves (191, 192) may be located at corners of a first imaginary polygon on the common carrier; the second positioning grooves (119A) may be located at corners of a second imaginary polygon on the first carrier (110); and the third positioning grooves (129A) may be located at corners of a third imaginary polygon on the second carrier (120).

The first, second and third positioning grooves (19, 119, 129) may have a substantially V-shaped cross-section.

The first, second and third positioning grooves (191, 192, 119A, 129A) may have a counter-pyramidal shape.

At least one of the common carrier (1) and the second carrier (120) may have a beam passing groove (17, 127) in which the light beam travels, the beam passing groove (17, 127) being a groove formed by a mechanical process.

The common carrier (1) may have a set of projections (19p); the first carrier may have first positioning grooves (119g) engaged with the set of projections (19p) so that the first carrier (110) is positioned on the common carrier (1); and the second carrier (120) may have second positioning grooves (129g) engaged with the set of projections (19p) so that the second carrier (120) is positioned on the common carrier (1), whereby the optical axes of the first and second components (2, 3) are aligned.

The first positioning grooves (119g) may have a width different from that of the second positioning grooves (129g), so that the first and second carriers (110, 120) have different heights on the common carrier (1) whereby optical axes of the first and second components (2, 3) are aligned.

Each of the projections (19p) may have a trapezoidal cross-section.

The first and second positioning grooves may have a cross-section corresponding to shapes of the projections (19p).

The common carrier (1) may have a first optical fiber guiding groove (13) in which an optical fiber (31) optically coupled with the first and second optical components (2, 3) is accommodated; and the second carrier (120) may have a second optical fiber guiding groove (123) in which the optical fiber (31) is accommodated so as to be put between the first and second optical fiber guiding grooves (13, 123).

The common carrier (1) may have a beam passing groove (17) coupled with the first optical fiber guiding groove (13), the light beam from the first optical component (2) traveling through the second optical component (3) and the beam passing groove (17) and entering into the optical fiber (13).

The optical device may be configured as follows. The second carrier (120) has a beam passing groove (127) coupled with the second optical fiber guiding groove (123), the light beam from the first component (2) traveling through the second optical component (3) and the beam passing groove (127) and entering into the optical fiber (13).

The optical device may further comprise a case (33) in which the common carrier (1), the first carrier (110) and the second carrier (120) are accommodated, the case having a hole in which an optical fiber insertion portion of the optical fiber (31) is inserted, and optical fiber fixing means (34) for fixing the optical fiber to the case so that the optical fiber can be detached from the case by an operation from an outside of the case.

The first optical component may include a plurality of light sources (2a, 301) and photodiodes (2b, 2c) supported by the first carrier; the second optical component may include a plurality of lenses (3a, 3b, 3c, 3d) placed in first guiding grooves (201) formed in the second carrier (200); the optical device may have a third optical component (39) which is placed in second guiding grooves (204) formed in the second carrier and directs laser beams from the light sources (2a, 301) in a predetermined direction.

The optical device may further comprise a common carrier (1) on which the first and second carriers (110, 120) are placed side by side, wherein: the first optical component includes a plurality of light sources (2); the second optical component includes a plurality of lenses (3); the common carrier has first guiding grooves (11) in which the lenses (13) are respectively placed; and the second carrier (120) has second guiding grooves (121) in which the lenses are respectively placed so that receive light beams of the respective, light sources.

The optical device may further comprise a third carrier (130) mounted on the common carrier, the third carrier having light waveguide paths (131) over which the light beams from the light sources (3) through the second carrier (120) travel.

The aforementioned objects of the present invention are also achieved by an optical device comprising: a first carrier (1); a second carrier (110); a first optical component (2) mounted on the first carrier; a second optical component (3) mounted on the second carrier; a first sub-carrier (210) stacked on the first carrier (110), a first sub-unit (1000) being formed by the first carrier and the first sub-carrier; a second sub-carrier (220) stacked on the second carrier, a second sub-unit (2000) being formed by the second carrier and the second sub-carrier; and rod-shaped engagement members coupling the first and second sub-units together, the first and second carriers and the first and second sub-carriers respectively having grooves (119, 129, 219, 229) with which the rod-shaped engagement members (8) are engaged, so that the first and second sub-units are relatively arranged so that optical axes of the first and second optical components are aligned so as to form a space between the first carrier (110) and the first sub-carrier (210) and between the second carrier (120) and the second sub-carrier (220), the space passing a light beam from the first optical component without being shaded.

The second carrier (120) and the second sub-carrier (220) may respectively have guiding grooves (121, 221) in which the second component is placed.

The rod-shaped engagement members (8) may have projecting portions with which another optical device can be attached.

The second carrier (120) and the second sub-carrier (220) may respectively have optical fiber guiding grooves (123, 223) in which an optical fiber (31) receiving the light beam from the first optical component (2) is accommodated.

The above optical fiber insertion portion may comprise: a cylindrical member (35) having an outer portion to be engaged with the first and second optical fiber guiding grooves (12, 123) and an inner hole accommodating the optical fiber; and a transparent window (37) located at an end of the optical fiber insertion portion so as to face an end of the optical fiber, the outer portion being integral with the case.

BRIEF DESCRIPTION OF THE DRAWINGS

Other objects, features and advantages of the present invention will become more apparent from the following detailed description when read in conjunction with the accompanying drawings, in which:

FIGS. 9A, 9B, 9C and 9D are diagrams showing a feature of the present invention;

FIGS. 18A, 18B and 18C are diagrams showing another height adjustment means;

FIG. 31 is a diagram of an optical device according to a sixth embodiment of the present invention;

FIGS. 39A, 39B and 39C are diagrams of an optical device according to a twelfth embodiment of the present invention;

DETAILED DESCRIPTION OF THE PREFERRED EMBODIMENTS

Figure 1A:
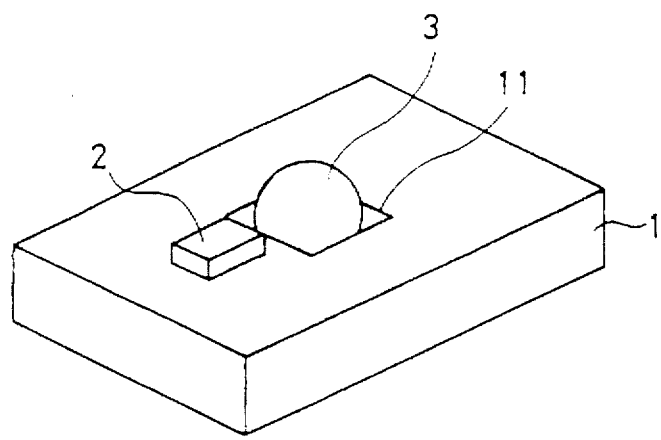
FIGS. 1A and 1B are diagrams showing a first conventional optical device.
Figure 1B:
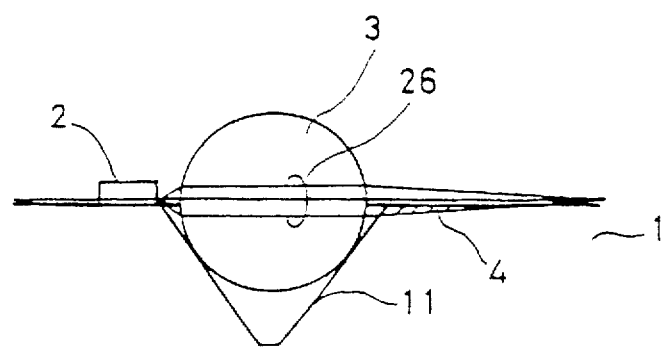
Figure 2A:
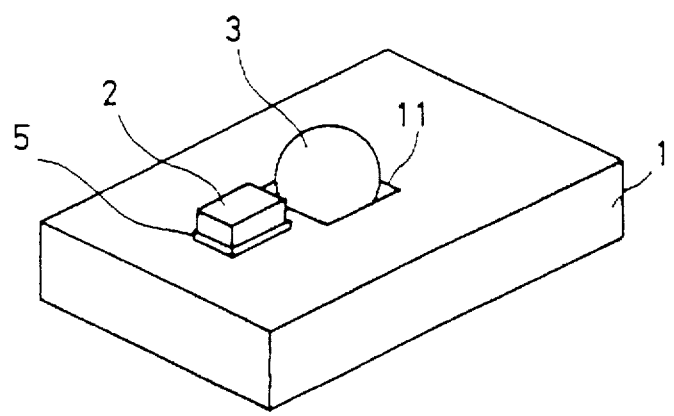
FIGS. 2A and 2B are diagrams showing a second conventional optical device.
Figure 2B:
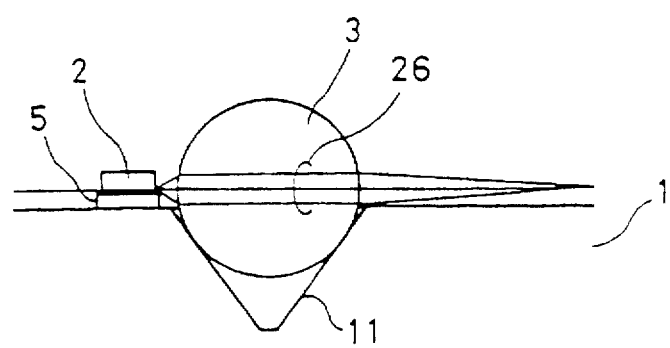
Figure 3:
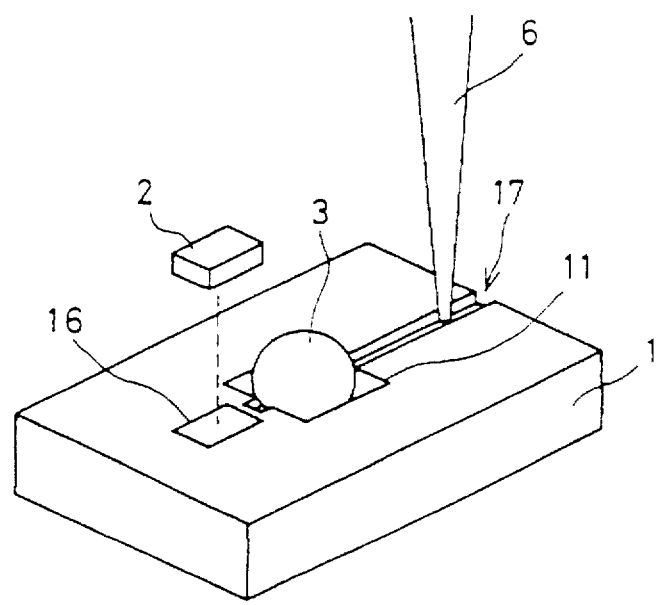
FIG. 3 is a perspective view of a third conventional optical device.

In order to achieve the aforementioned objects of the present invention, the present invention uses first means and second means.

The first means includes a structure which makes it possible to easily form a beam passing groove in a carrier by etching, a mechanical grinding process such as a dicing saw or a combination thereof. By forming the beam passing groove, it is possible to prevent the light beam propagated over the carrier from being shaded. This is because the formation of the beam passing groove increases the space between the main surface of the carrier and the optical axis of an optical component placed thereon.

The first means includes the following three structures (1), (2) and (3).

In the first structure (1), a lens guide groove and a groove which will be shaped in a beam passing groove are formed in a carrier by etching so that a slight interference portion preventing the light beam traveling in the beam passing groove remains therebetween. Then, the interference portion between the lens guide and the groove is processed so that a belt-shaped (stripe- or band-shaped) groove is formed in the direction perpendicular to the optical axis so as to bridge the lens guide and the groove. According to the above steps, it is possible to easily form the beam passing groove and the lens guiding groove.

The second structure (2) of the first means uses two carriers. A beam passing groove is mechanically formed along the optical axis in only one of the carriers. An optical component having a relatively large optical-axis/carrier distance such as a lens is mounted on the carrier on which the beam passing groove is formed. Then, the two carriers are positioned so that the optical components are aligned.

There are provided the following two methods (2-a) and (2-b) for positioning the two carriers.

The method (2-a) is directed to arranging the two carriers in series along the optical axis. Now, the two carriers are respectively referred to as first and second carriers. The first carrier and the second carrier include easily producible positioning means capable of aligning themselves each other with high precision. The second carrier further includes a mechanically formed beam passing groove. An optical component having a relatively small optical-axis/carrier distance, such as a semiconductor laser diode chip, is mounted on the first carrier. An optical component having a relatively large optical-axis/carrier distance, such as a lens, is mounted on the second carrier. The first and second carriers are positioned by the positioning means capable of performing the relative positioning with high precision.

There are three easily producible positioning means [1], [2] and [3] capable of performing relative positioning.

The first positioning means [1] uses cylindrical members arranged in parallel on a common carrier. The first and second carriers respectively have grooves having a substantially V-shaped cross section in which the cylindrical members are engaged.

The second positioning means [2] uses a plurality of spherical members arranged on the common carrier. The first and second carriers respectively have grooves having a counter-pyramidal shape. The spherical members are engaged with the grooves.

The third positioning means [3] uses a combination of a common cylindrical member and grooves that are formed on the first and second carriers and have a primarily V-shaped cross-section. By engaging the grooves of the first and second carriers with the common cylindrical member, it is possible to align the first and second carriers.

The method (2-b) of positioning the two carriers includes at least first and second carriers. The first carrier includes positioning means which can easily be produced with high precision and includes the function of adjusting the position in the direction perpendicular to the main surface of the carrier. Further, the first carrier includes a beam passing groove formed by a process capable of locally forming, such as etching. Hereinafter, the position in the direction perpendicular to the main surface of the second carrier may be sometimes referred to as height. The second carrier includes positioning means which can easily be produced with high precision and includes the function of adjusting the height. Further, the second carrier includes a beam passing groove mechanically formed. An optical component having a relatively small optical-axis/carrier distance, such as a semiconductor laser diode chip, is mounted on the first carrier and located at a position close to the beam passing groove. An optical component which handles the light beam having a relatively large spot size, such as a lens, is mounted on the second carrier. The first and second carriers are positioned and put upon each other so that the optical component mounted on the second carrier, such as a lens, is accommodated in the beam passing groove formed on the first carrier.

The above positioning means which can easily be produced with high precision and includes the height adjusting function includes, for example, a manner of engaging grooves having a counter-pyramidal shape formed on the first and second carriers with a plurality of spherical members.

The third structure (3) of the first means is a variation of the above method (2-b). More particularly, the second carrier does not have the beam passing groove. The first and second carriers are arranged so that there is a sufficient distance between the main surface of the first carrier and the second carrier by using the above positioning means.

The second means of the present invention uses at least first and second carriers. Optical components are mounted on the first and second carriers. Thereafter, the relatively heights of the first and second carriers are adjusted. For example, the first and second carriers are arranged on a common plane depending on the optical-axis heights or the beam spot size.

The first carrier includes positioning means which can easily be produced with high precision and includes the function of adjusting the height. The second carrier includes positioning means which can easily be produced with high precision and includes the function of adjusting the height. An optical component which handles the light beam having a relatively large spot size, such as a lens, is mounted on the second carrier. The first and second carriers are subjected to a relative positioning process and height adjusting process by the position means.

By way of example, the carriers are made of silicon, and the grooves can be formed on the carriers by anisotropic etching. A cylindrical member or a spherical member is engaged with the grooves. In this way, it is possible to easily and precisely position the first and second carriers in the transverse and height directions. It is desirable that the guide structures be formed in the same surface of the carriers as the optical components in order to prevent degradation of positioning of the carriers due to the difference between the thicknesses of the carriers.

There are provided the following six easily producible, highly precise positioning means for the carriers including the height adjusting means.

(a) A plurality of cylindrical members are arranged in parallel on the common carrier. First, grooves having a substantially V-shaped cross-section are formed on the first carrier, and second grooves having a substantially V-shaped cross-section are formed on the second carrier. The cylindrical members are engaged with the first and second grooves. The width of the first grooves and/or the width of the second grooves is changed for adjustment.

(b) At least one first pair of cylindrical members is arranged in parallel on the common carrier, and is engaged with grooves having a substantially V-shaped cross-section and formed on the first carrier. At least one second pair of cylindrical members is arranged in parallel on the common carrier so as to be perpendicular to the first pair of cylindrical members. The second pair of cylindrical members is enraged with grooves having a substantially V-shaped cross-section and formed on the second carrier. The adjustment can be performed by changing the diameter of the first pair of cylindrical members and/or the diameter of the second pair of cylindrical members.

(c) A plurality of spherical members are arranged in parallel on the common carrier. The first and second carriers respectively include grooves having counter-pyramidal shapes with which the spherical members are engaged. The adjustment can be performed by changing the width of the counter-pyramidal shape of the grooves of the first carrier and/or the width of the counter-pyramidal shape of the grooves of the second carrier.

(d) A plurality of first spherical members are arranged in parallel on the common carrier, and are engaged with a plurality of grooves having a counter-pyramidal shape formed on the first carrier. A plurality of second spherical members are arranged in parallel on the common carrier, and are engaged with a plurality of grooves having a counter-pyramidal shape. The adjustment can be performed by changing the diameter of the first spherical members and/or the diameter of the second spherical members.

(e) A common cylindrical member is partially put between a groove that has a substantially V-shaped cross-section and is formed on the first carrier and a third carrier, and is partially put between a groove that has a substantially V-shaped cross-section and is formed on the second carrier and a fourth carrier. The adjustment can be performed by changing the width of the groove of the first carrier and/or the width of the groove of the second carrier.

(f) A plurality of projections having a V-shaped or trapezoidal cross-section are formed on the common carrier. The first and second carriers have grooves having a V-shape, which are engaged with the projections. The adjustment can be performed by changing the width of the projections and/or the width of the grooves of the first and/or the second carriers.

The functions and effects of the structures of the present invention will now be described. According to the aforementioned first means, the beam passing groove can be formed by the etching or mechanical abrasion process or the combination thereof. Hence, it is possible to easily form the beam passing groove for a short time.

The structure (1) of the first means, the groove for guiding an optical component such as a lens and the groove along which the beam travels are formed on the carrier as independent grooves by anisotropic etching. By separately forming the groove for guiding the lens or the like, it is possible to precisely position the optical component to be guided. Since the beam passing groove can be formed as the component guiding groove, a plurality of grooves can be formed on the carrier at one time. Further, a plurality of carriers can be concurrently subjected to the etching process, and therefore the production time for each carrier can be reduced.

According to the structure (1) of the first means, a lens guide and a groove which will be shaped in a beam passing groove are formed in a carrier by etching so that a slight interface portion remains therebetween. Then, the interface portion between the lens guide and the groove is ground so that a belt-shaped groove is formed in the direction perpendicular to the optical axis so as to bridge the lens guide and the groove so that the beam passing groove can be formed. According to the above steps, it is possible to easily form the beam passing groove for a short time because the grinding process for linearly grinding the carrier is needed only one time.

According to the structure (2) of the first means, the two carriers are used, one of which is used to support the semiconductor laser diode chip and the other carrier is used to support the lens. In this manner, the carriers are separately utilized in terms of functions thereof. With this structure, it is possible to easily and mechanically form the beam passing grooves along the passage of the beam. This advantage will now be described in more detail.

Figure 8A:
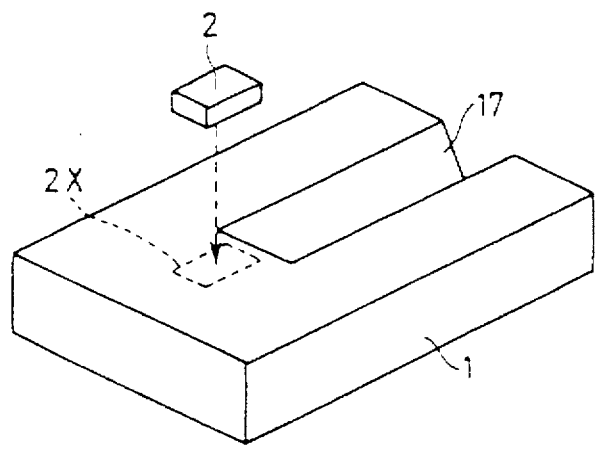
FIGS. 8A and 8B are diagrams showing a method for forming a beam passing groove in a carrier.
Figure 8B:
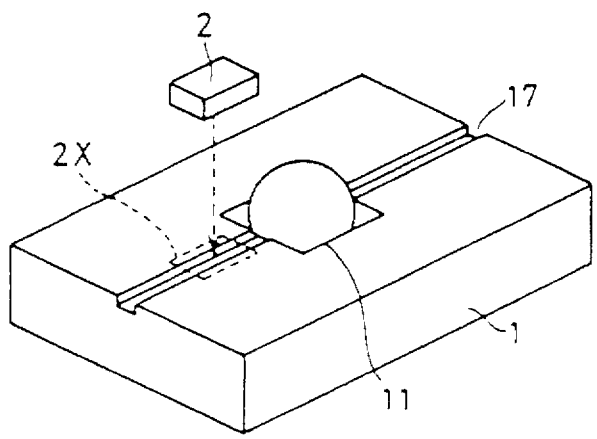

FIGS. 8A and 8B show an example of the process of forming the beam passing groove. More particularly, FIG. 8A shows a carrier having a groove partially formed on the main surface thereof, and FIG. 8B shows a carrier having a beam passing groove formed by a mechanical process (abrasion) such as dicing saw. The difficulty in mechanically forming the beam passing groove is due to the step of mounting two optical components on a single (common) carrier. This will be described below.

In the case shown in FIG. 8A, the beam passing groove can be formed while a portion 2X on which an optical component (for example, the semiconductor laser diode chip 2) should be placed remains. However, in the case shown in FIG. 8B, the groove is formed in the portion 2X on which the optical component should be placed. Due to the above groove, it becomes difficult to mount an optical component having a small size such as the semiconductor laser diode chip 2 on the carrier on which the mechanically formed beam passing groove is provided.

FIGS. 9A through 9D are diagrams showing the first structure (1) of the first means. More particularly, FIG. 9A shows a first carrier 120, and FIG. 9B shows a beam passing groove 127 formed on the main surface of the first carrier. FIG. 9C shows a second carrier 110, and FIG. 9D shows a state in which the first and second carriers 120 and 110 are relatively positioned.

As shown in FIG. 9A, a guide 121 for guiding an optical component having a relatively large size, such as a lens, is formed on the first carrier 120 by etching. Next, as shown in FIG. 9B, the beam passing groove 127 of a belt shape is mechanically formed on the first carrier 120 along the passage of the light beam.

The second carrier 110 shown in FIG. 9C is used to support an optical component having a small optical-axis/carrier distance and a relatively small size, such as a semiconductor laser diode chip. No groove is formed on the second carrier 110. Then, as shown in FIG. 9D, the first carrier 120 and the second carrier 110 are relatively positioned so that the semiconductor laser diode chip 2 and lens 3 face each other.

Figure 10:
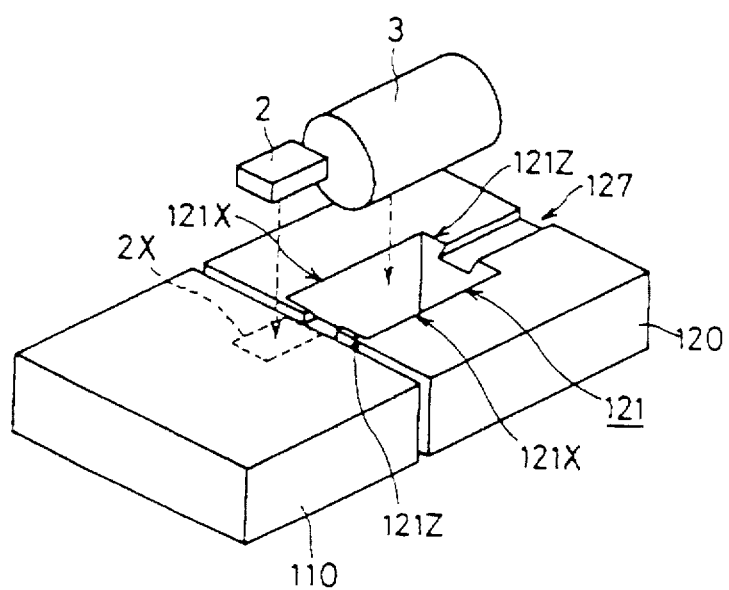
FIG. 10 is a perspective view of another feature of the present invention.

FIG. 10 shows the second structure (2) of the first means. Although FIG. 9D shows the structure using the spherical lens 3, a lens having a cylindrical shape (cylinder-shaped lens) can be used instead of the spherical lens 3. For example, as shown in FIG. 10, a guide 121 having a rectangular opening is formed on the first carrier 120. The cylinder-shaped lens 3 is put in the guide 121. In the structure shown in FIG. 10, the cylinder-shaped lens 3 is positioned in the direction parallel to the optical axis by means of sides 121X of the opening, and is positioned in the perpendicular direction thereto by means of sides 121Z thereof. Hence, the cylinder-shaped lens 3 can be positioned at the specific point because the lens 3 is prevented from moving by the sides 121X and 121Z.

According to the first and second structures (1) and (2) of the first means, it is possible to easily form the beam passing groove for a short time. In this case, it is possible to employ the positioning means [1], [2] and [3] of the means (2-a) for positioning the two carriers. These positioning means make it possible to precisely position the two carriers so that the target transverse position and height of the optical components can be obtained. More particularly, the transverse position of the optical components can be defined by stacking the two carriers so that cylindrical or spherical members are sandwiched by the two carriers or simply stacking the two carriers respectively having grooves that have a substantially V-shaped cross-section and are formed by anisotropic etching. The height of the optical components can be adjusted only by changing the width of the grooves. The pattern that defines the position and size of the openings of the grooves can be formed by photolithograph technology. Hence, the height adjusting process for the optical components can be precisely performed.

In the structure (2), it is possible to employ the method (2-b) in which the beam passing groove is mechanically formed only on the first carrier, and the beam passing groove is formed by etching.

Figure 11A:
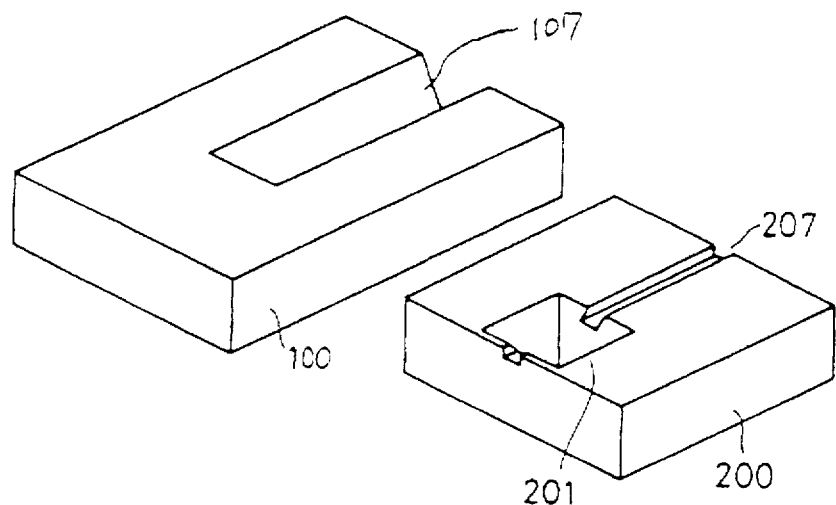
FIGS. 11A and 11B are perspective views of yet another feature of the present invention.
Figure 11B:
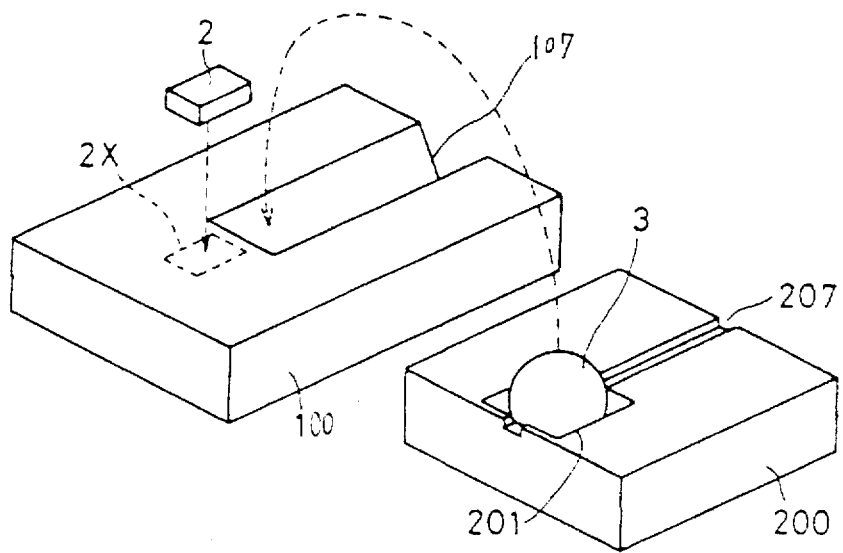

FIGS. 11A and 11B shows the structure (2) of the first means. More particularly, FIG. 11A shows a first carrier (which corresponds to the aforementioned carrier 100 and a second carrier 200, and FIG. 11B shows the step of stacking the first carrier 1 and the second carrier 200. The beam passing groove 107 is formed on the first carrier 100 by etching. As shown in FIG. 11B, it is possible to prevent the laser beam from being shaded by disposing the semiconductor laser diode chip 2 in the vicinity of the edge portion of the beam passing groove 107.

The second carrier 200 has a guide 201 for guiding a lens such as the spherical lens 3. After the guide 201 is formed, a beam passing groove 207 of a belt shape is mechanically formed on the second carrier 200 along the passage of the laser beam by means of a dicing saw or the like. The semiconductor laser diode chip 2 is mounted on the first carrier 1, and the lens 3 is mounted on the second carrier 200. Then, as shown in FIG. 11B, the first carrier 100 and the second carrier 200 are positioned so that the chip 2 and the lens 3 face each other.

Figure 12:
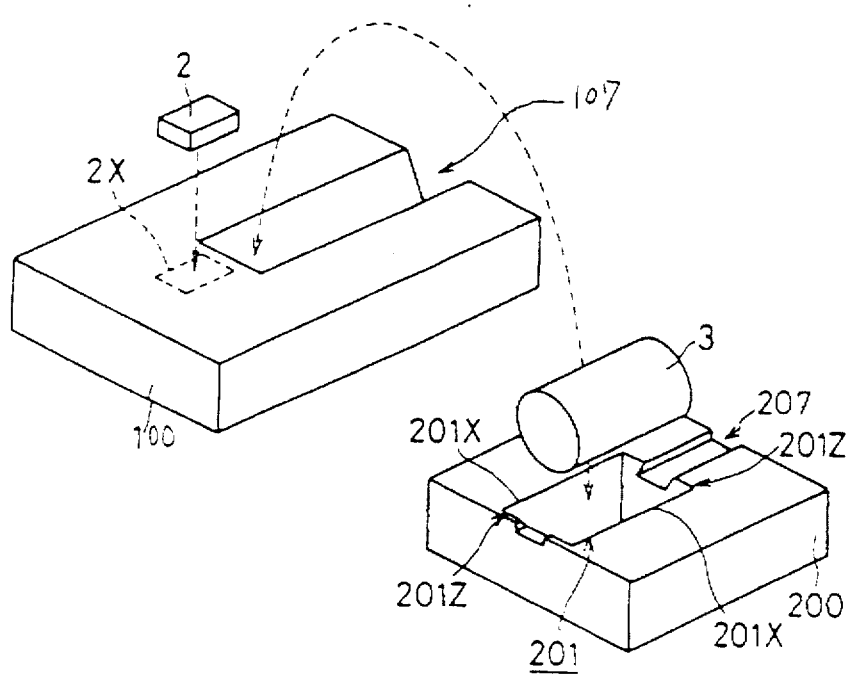
FIG. 12 is a perspective view of a further feature of the present invention.

FIG. 12 shows another variation of the structure (2) different from the structure shown in FIGS. 11A and 11B. The spherical lens 3 used in the structure shown in FIGS. 11A and 11B is replaced by the cylinder-shaped lens 3 in the structure shown in FIG. 12. The guide 201 is formed and the cylinder-shaped lens 3 is placed therein. The cylinder-shaped lens 3 is positioned in the direction parallel to the optical axis by means of sides 201 of the opening, and is positioned in the direction perpendicular thereto by means of sides 201Z thereof. Hence, the cylinder-shaped lens 3 can be positioned at the specific point because the lens 3 is prevented from moving by the sides 201X and 201Z.

In the structure shown in FIG. 12, positioning means shown in FIG. 43 will be employed. This positioning means use positioning grooves 19A having a counter-pyramidal shape formed on the carrier 100 and positioning grooves 209 having a counter-pyramidal shape formed on the carrier 200. The first carrier 100 and the second carrier 200 are positioned so that spherical members 209 are sandwiched between the corresponding grooves of the first carrier 1 and the second carrier 200. With this structure, it is possible to precisely define the transverse positions and the heights of the optical components. In this case, the lens 3 guided by the guide groove 201 of the second carrier 200 is accommodated in the beam passing groove 107 of the first carrier 100. Hence, a space for optical coupling and allowing the light beam to pass can be ensured.

It is possible to use the third structure (3) of the first means, which is related to the aforementioned means (2-b) and is directed to combining the two carriers so as to obtain a sufficient separation between the first and second carriers.

Figure 13A:
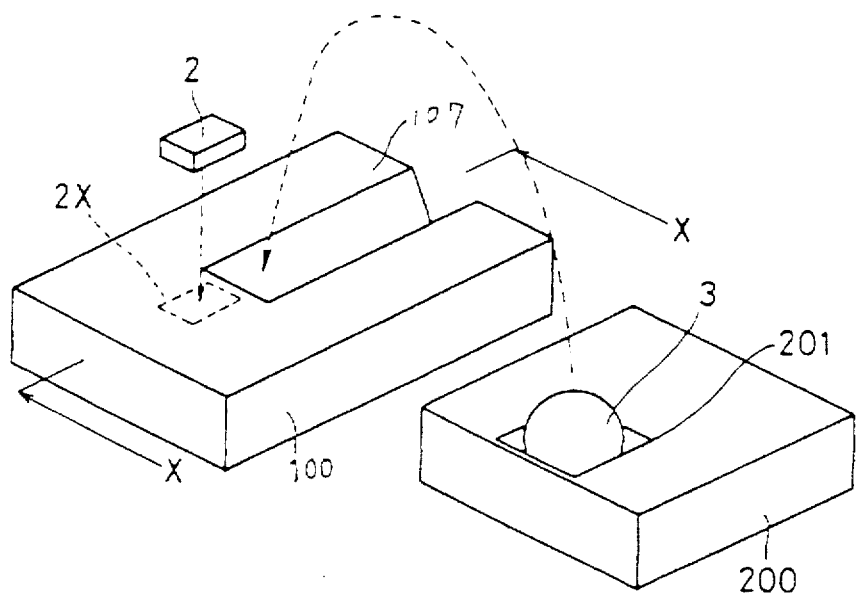
FIGS. 13A and 13B are diagrams showing another feature of the present invention.
Figure 13B:
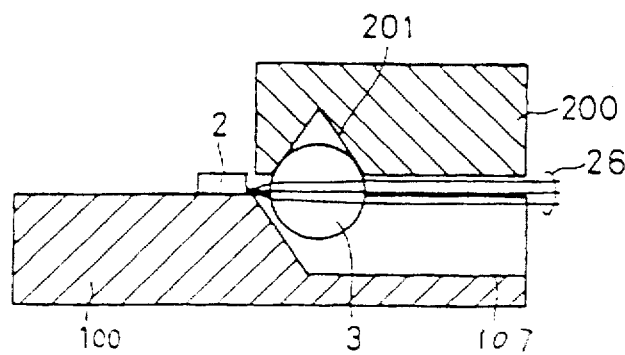

FIGS. 13A and 13B show an example of the third structure (3). More particularly, FIG. 13A show a way of stacking the first carrier 100 and the second carrier 200, and FIG. 13B is a cross-sectional view taking along line X—X shown in FIG. 13A in the stacked (assembled) state. It will be noted that a space for passing the light beam can be ensured although the second carrier 200 does not have any beam passing groove.

Figure 14:
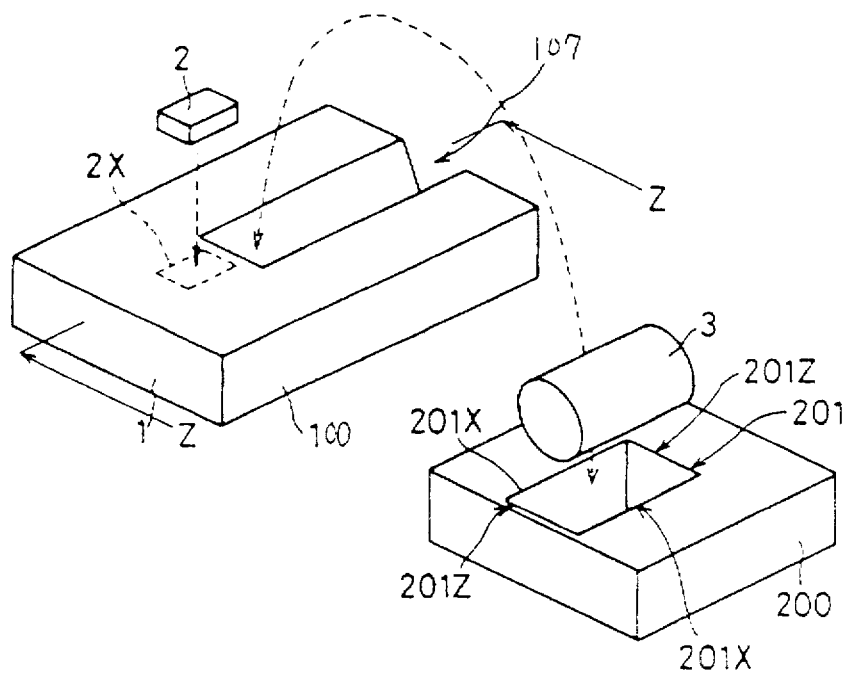
FIG. 14 is a perspective view of another feature of the present invention.

FIG. 14 shows another version of the third structure different from the structure shown in FIGS. 13A and 13B. The spherical lens 3 shown used in the structure shown in FIGS. 13A and 13B is replaced by the cylinder-shaped lens 3 in the structure shown in FIG. 14. The guide 201 is formed and the cylinder-shaped lens 3 is placed therein. The cylinder-shaped lens 3 is positioned in the direction parallel to the optical axis by means of sides 201 of the opening, and is positioned in the direction perpendicular thereto by means of sides 201Z thereof. Hence, the cylinder-shaped lens 3 can be positioned at the specific point because the lens 3 is prevented from moving by the sides 201X and 201Z.

The aforementioned second means used in the present invention can perform the relative positioning of the optical components by positioning the carriers. This structure provides the following advantages with regard to adjustment of the transverse positions and the heights of the optical components.

The reason why there is difficulty in matching the relative heights of two optical components is that the two optical components are designed to be placed on a single (common) carrier. When two optical components have different shapes and/or different sizes, it is very difficult to adjust the heights of the optical components on the carrier. The second means is intended to facilitate positioning of the heights of the optical components to be positioned. For the above purpose, the second means realizes precise positioning of the optical components by positioning two (a plurality of) carriers on which the respective optical components are mounted.

Figure 15A:
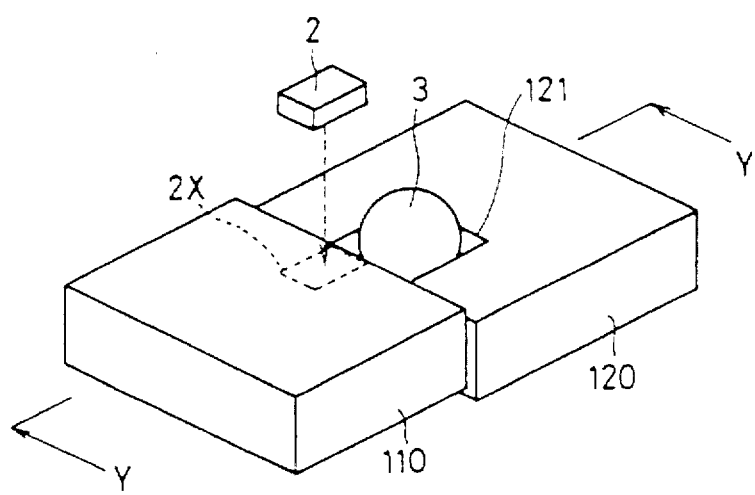
FIGS. 15A and 15B are diagrams of another feature of the present invention.
Figure 15B:
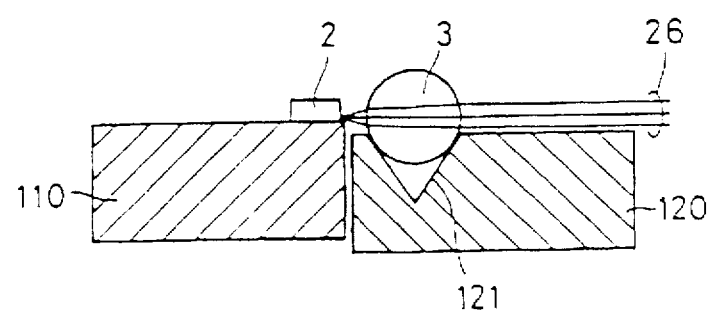

FIGS. 15A and 15B show an example of the second means. More particularly, FIG. 15A shows a step of positioning the first carrier 110 and the second carrier 120, and FIG. 15B is a cross-sectional view taken along line Y—Y shown in FIG. 15A in the positioned state. The semiconductor laser diode chip 2 is mounted on the first carrier 110, and the spherical lens 3 is mounted on the second carrier 120. The first carrier 110 and the second carrier 120 have an identical shape and an identical size. Hence, it is possible to easily position the first carrier 110 and the second carrier 120.

Figure 16:
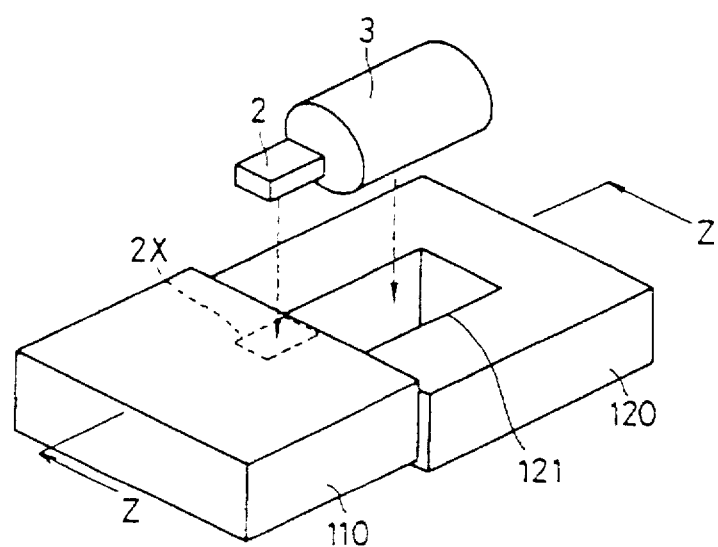
FIG. 16 is a perspective view of another feature of the present invention.

FIG. 16 shows a variation of the second means different from the structure shown in FIGS. 15A and 15B. The spherical lens 3 shown used in the structure shown in FIGS. 15A and 15B is replaced by the cylinder-shaped lens 3 in the structure shown in FIG. 16. The guide 121 is formed and the cylinder-shaped lens 3 is placed therein. The cylinder-shaped lens 3 is positioned in the direction parallel to the optical axis by means of sides of the opening in the same direction as above, and is positioned in the direction perpendicular thereto by means of sides thereof in the same direction as above. Hence, the cylinder-shaped lens 3 can be positioned at the specific one point because the lens 3 is prevented from moving by the sides.

More particularly, the positioning is performed by engaging cylindrical or spherical members with grooves formed on the silicon carrier by anisotropic etching, and any of the aforementioned positioning structures (a)–(f) of the second means including the respective height adjusting functions is used to perform the adjustment process.

Figure 17A:
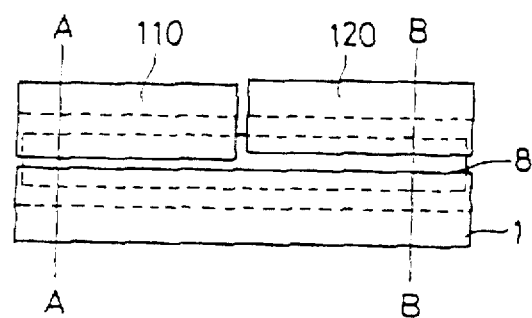
FIGS. 17A, 17B and 17C are diagrams showing a height adjustment means.
Figure 17B:
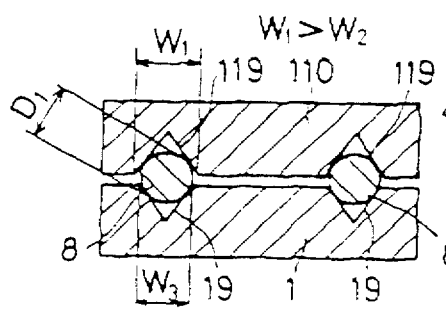
Figure 17C:
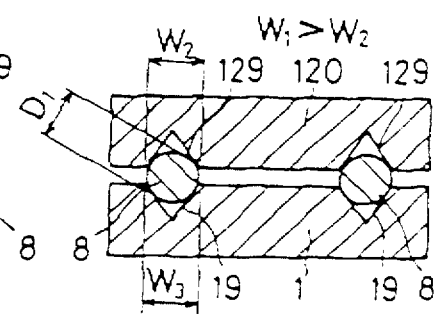

FIGS. 17A through 17C show the positioning structure (a) having a height adjusting function. More particularly, FIG. 17A is a side view of an optical device having the structure (a). FIG. 17B is a cross-sectional view taken along line A—A shown in FIG. 17A, and FIG. 17C is a cross-sectional view taken along line B—B shown in FIG. 17A. The common carrier 1 has V-shaped grooves 19 (having a V-shaped cross-section). The first carrier 110 has V-shaped grooves 119, and the second carrier 120 has V-shaped grooves 129. The grooves 19, 119 and 129, with which rod-shaped members 8 having, for example, a cylindrical shape are engaged, are denoted by symbols $W_3$, $W_1$ and $W_2$, respectively. The width $W_1$ is greater than $W_2$ ($W_1 > W_2$). As shown in FIGS. 17B and 17C, it is possible to adjust the heights of the first carrier 110 and the second carrier 120 with respect to the common carrier 1 by changing the width of the first carrier 110 and/or the width of the second carrier 120. When the carriers are made of silicon, it is possible to precisely adjust the widths $W_1$ and $W_2$, and thus precisely define the heights of the carriers 110 and 120 with respect to the common carrier 1.

FIGS. 18A through 18C show the positioning structure (b) having a height adjusting function. More particularly, FIG. 18A is a side view of an optical device having the structure (b). FIG. 18B is a cross-sectional view taken along line A—A shown in FIG. 18A, and FIG. 18C is a cross-sectional view taken along line B—B shown in FIG. 18A. The structure shown in FIG. 18B uses cylindrical members 81 having a diameter $D_1$, and the structure shown in FIG. 18C uses cylindrical members 82 having a diameter $D_2$ greater than the diameter $D_1$ ($D_2 > D_1$). As shown in FIGS. 18B and 18C, it is possible to adjust the heights of the first carrier 110 and the second carrier 120 with respect to the common carrier 1. When the cylindrical members 81 and 82 are made of a rigid material such as glass or ceramics, it is possible to more precisely adjust the diameters of the cylindrical members 81 and 82 and therefore more precisely define the heights of the first carrier 110 and the second carrier 120.

Figure 19A:
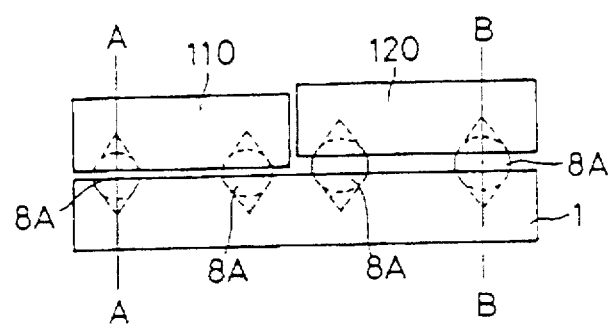
FIGS. 19A, 19B and 19C are diagrams showing yet another height adjustment means.
Figure 19B:
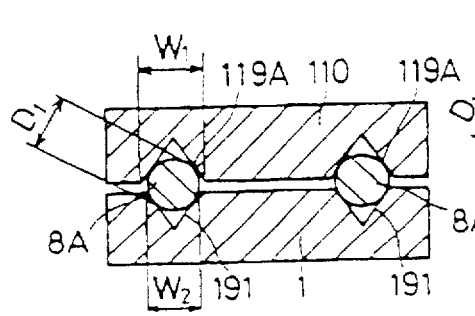
Figure 19C:
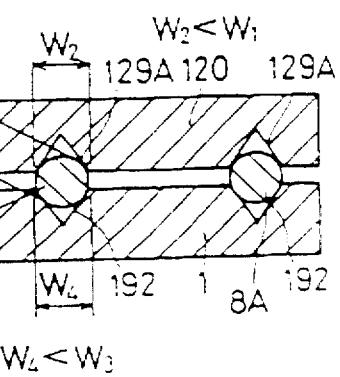

FIGS. 19A through 19C show the positioning structure (c) having a height adjusting function. More particularly, FIG. 19A is a side view of an optical device having the structure (c). FIG. 19B is a cross-sectional view taken along line A—A shown in FIG. 19A, and FIG. 19C is a cross-sectional view taken along line B—B shown in FIG. 19A. The structure shown in FIGS. 19B and 19C uses spherical members 8A having a diameter $D_1$. The first carrier 110 has counter-pyramidal grooves 119A having a width $W_1$, and the second carrier 120 has counter-pyramidal grooves 129A having a width $W_2$ less than the width $W_1$ ($W_2 < W_1$). The common carrier 1 shown in FIG. 19B has counter-pyramidal grooves 191 having a width $W_3$. The common carrier 1 shown in FIG. 19C has counter-pyramidal grooves 192 having a width $W_4$ less than the width $W_3$ ($W_4 < W_3$). By adjusting any of the widths $W_1$–$W_4$, it is possible to adjust the height of the first carrier 110 and/or the height of the second carrier 120. When the carriers are made of silicon, it is possible to precisely define the widths and thus precisely define the heights of the first carrier 110 and the second carrier 120.

Figure 20A:
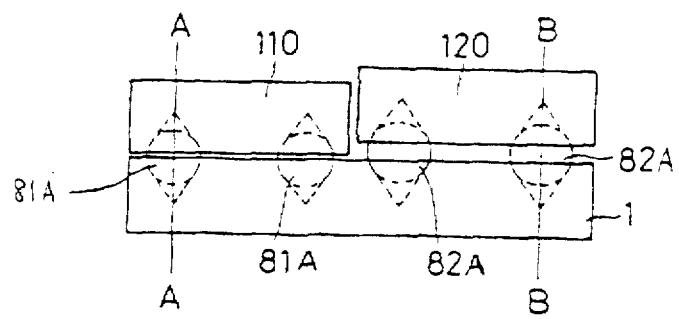
FIGS. 20A, 20B and 20C are diagrams showing a further height adjustment means.
Figure 20B:
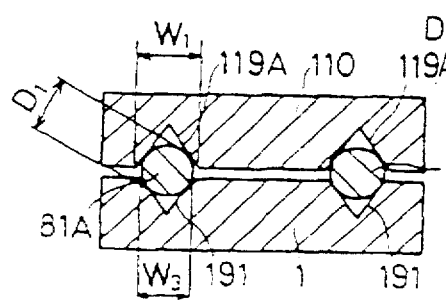
Figure 20C:
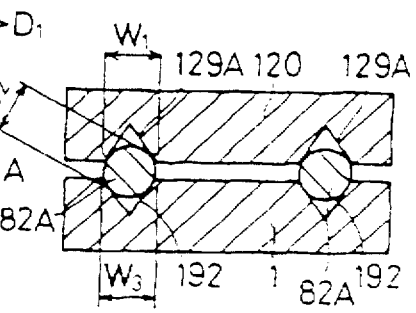

FIGS. 20A through 20C show the positioning structure (d) having a height adjusting function. More particularly, FIG. 20A is a side view of an optical device having the structure (d). FIG. 20B is a cross-sectional view taken along line A—A shown in FIG. 20A, and FIG. 20C is a cross-sectional view taken along line B—B shown in FIG. 20A. The structure shown in FIG. 20B uses spherical members 81A having a diameter $D_1$, and the structure shown in FIG. 20C uses spherical members 81B having a diameter $D_2$ greater than the diameter $D_1$. The first carrier 110 and the second carrier 120 are the same as those shown in FIGS. 19A, 19B and 19C. The common carrier 1 has counter-pyramidal grooves 191 having a width $W_3$. By adjusting either of the diameter $D_1$ or $D_2$ or both, it is possible to adjust the height of the first carrier 110 and/or the height of the second carrier 120. When the spherical members are made of a rigid material such as glass or ceramics, it is possible to precisely define the diameters $D_1$ and $D_2$ and thus precisely define the heights of the first carrier 110 and the second carrier 120.

Figure 21A:
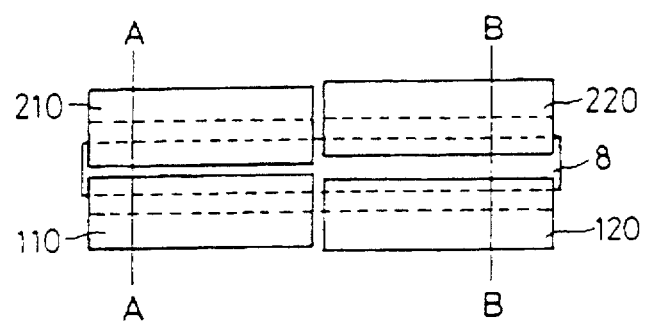
FIGS. 21A, 21B and 21C are diagrams showing another height adjustment means.
Figure 21B:
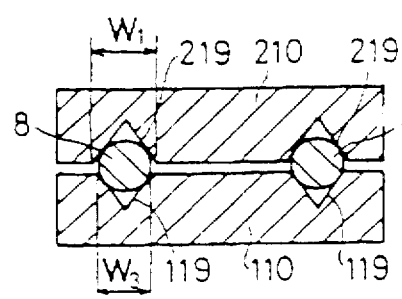
Figure 21C:
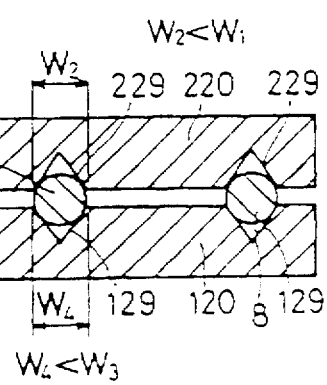

FIGS. 21A through 21C show the positioning structure (e) having a height adjusting function. More particularly, FIG. 21A is a side view of an optical device having the structure (e). FIG. 21B is a cross-sectional view taken along line A—A shown in FIG. 21A, and FIG. 21C is a cross-sectional view taken along line B—B shown in FIG. 21A. The common carrier 1 has V-shaped grooves 119 having a width $W_3$ shown in FIG. 21B or a width $W_4$ shown in FIG. 21C ($W_4 < W_3$). A first carrier 210 has V-shaped grooves 219 having a width $W_1$, and a second carrier 220 has V-shaped grooves 229 having a width $W_2$ less than the width $W_1$ ($W_2 < W_1$). The grooves 119, 129, 219 and 229 are engaged with the cylindrical members 8. It is possible to adjust the heights of the first carrier 210 and the second carrier 220 with respect to the common carrier 1 by changing any of the widths $W_1 W_4$. When the carriers are made of silicon, it is possible to precisely adjust the widths $W_1$–$W_4$, and thus precisely define the heights of the carriers 210 and 220 with respect to the common carrier 1.

Figure 22A:
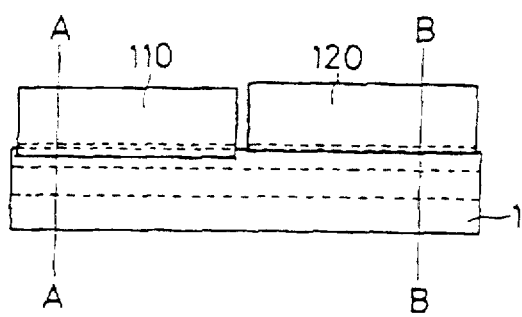
FIGS. 22A, 22B and 22C are diagrams showing another height adjustment means.
Figure 22B:
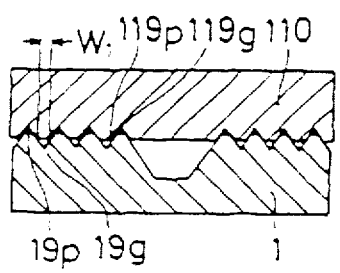
Figure 22C:
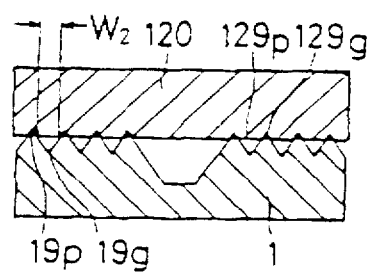

FIGS. 22A through 22C show the positioning structure (f) having a height adjusting function. More particularly, FIG. 22A is a side view of an optical device having the structure (f). FIG. 22B is a cross-sectional view taken along line A—A shown in FIG. 22A, and FIG. 22C is a cross-sectional view taken along line B—B shown in FIG. 22A. As shown in FIG. 22B, the first carrier 110 has grooves 119g having a V-shaped cross-section and projections 119p having a trapezoidal shape. The second carrier 120 shown in FIG. 22C has V-shaped grooves 129g having a different size from the grooves 119g and projections 129p having a trapezoidal cross-section and a size different from the projections 119p. The common carrier 1 has grooves 19g and projections 19p. The above grooves are periodically arranged, and the above projections are periodically arranged.

When the projections are engaged with the grooves, it is possible to precisely adjust the height of the carrier 110 and/or the height of the carrier 120 by adjusting only the width of the grooves and/or the width of the projections. When the carriers are made of silicon, it is possible to precisely define the grooves having the target widths. Hence, it is possible to precisely adjust the heights of the carriers 110 and 120 with respect to the common carrier 1.

In the structure shown in FIGS. 22A–22C, the common carrier has four projections 19p on one side and 8 projections in total. However, it is possible to form one projection on one side. In this case, each of the carriers 110 and 120 has only one groove on one side. When the common carrier 1 has one groove 19g, each of the carriers 110 and 120 has only one projection 119p or 129p on one side.

As described above, the structures (a)–(f) make it possible to precisely adjust the heights of the carriers with respect to the common carrier in the simple ways. A pattern which defines the positions of the grooves, the sizes of the cylindrical or spherical members or the widths of the projections can be formed by photolithograph technology. Hence, it is possible to perform the extremely precise adjustment of the components in the transverse and height directions. The spherical or cylindrical members can easily be formed mechanically with high precision. This contributes to improvement in the precision of adjusting the optical components in the transverse and height directions.

A description will now be given, with reference to the remaining accompanying drawings, of embodiments of the present invention while paying attention to various essential features.

Feature (1)

In an optical device as shown in any of FIGS. 23A–23B, 25A–25D, 26A–26B and 49A–49C, a first optical component of a chip shape (2, 2a, 2b, 2c) and a second optical component having a spherical or cylindrical shape are aligned so that the optical axes of the first and second components 3, 3a, 3b, 3c, 3d are aligned. The light beam is formed in the direction connecting the first and second components together and along the extension thereof.

In this case, the first optical component (2, 2a, 2b, 2c) is mounted on the common carrier (1). The second optical component (3, 3a, 3b, 3c) is guided by and is partially accommodated in an optical component guiding groove (11, 11a, 11b, 11c) formed on the carrier (1). A beam passing groove (17) in which the light beam travels from the vicinity of the guiding groove (11, 11a, 11b, 11c) along the optical axis is formed on the side of the second optical component (3, 3a, 3b, 3c) opposite to the side thereof on which the first optical component (2, 2a, 2b, 2c) is located. A plurality of belt-shaped grooves (18, 181, 182, 184, 185) are formed on the common carrier (1) so that the grooves are perpendicular to the beam passing groove and partially overlap with both the optical component guiding groove and the beam passing groove. Hence, the light beam traveling along the beam passing groove (17) is not prevented from being shaded at a position lower than the top of the common carrier (1).

Feature (2)

Figure 26A:
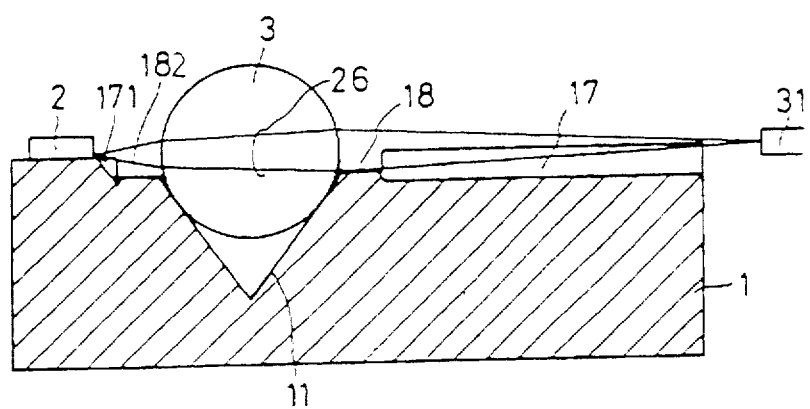
FIGS. 26A and 26B are diagrams of an optical device according to a second embodiment of the present invention.
Figure 26B:
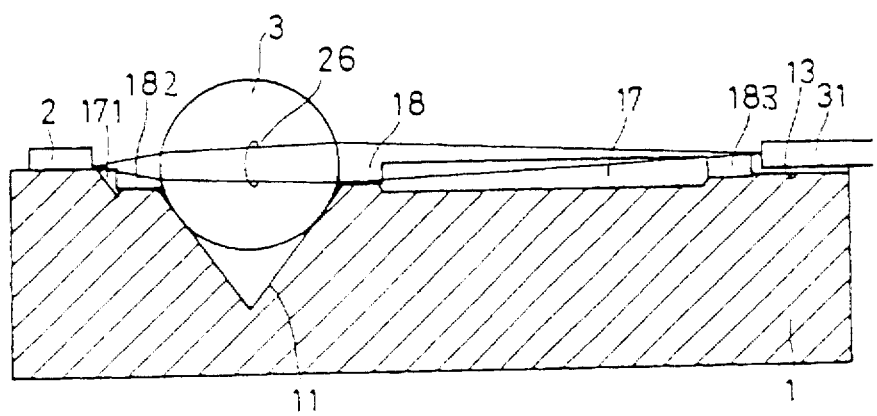

As shown in FIGS. 26A and 26B, in addition to the feature (1), a second beam passing groove (171) in which the light beam travels along the optical axis is formed on the common carrier (1) and is located between the first optical component (2) and the second optical component (3). Further, a belt-shaped groove (181) is formed on the common carrier (1) so as to be perpendicular to the beam passing groove (171) and partially overlap with the optical component guiding groove (11) and the beam passing groove (171). Hence, the light beam traveling along the beam passing groove (171) is not prevented from being shaded at a position lower than the top of the common carrier (1).

Feature (3)

Figure 24A:
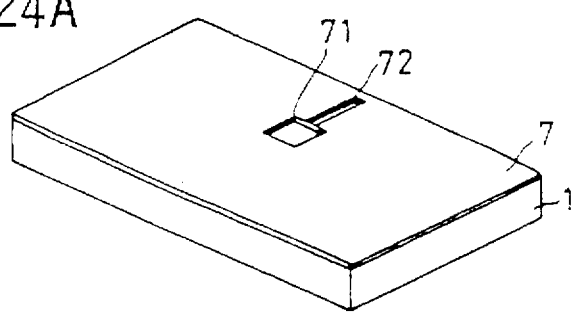
FIGS. 24A, 24B and 24C are diagrams of steps of producing a carrier used in the device shown in FIGS. 23A and 23B.
Figure 24B:
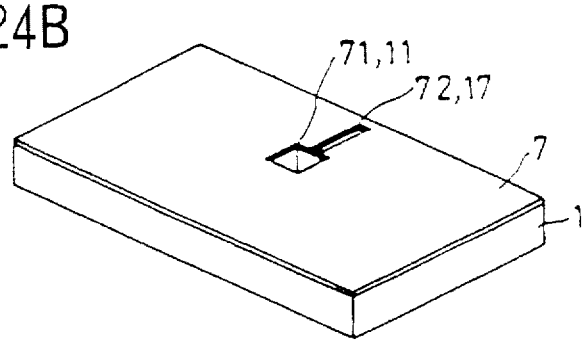
Figure 24C:
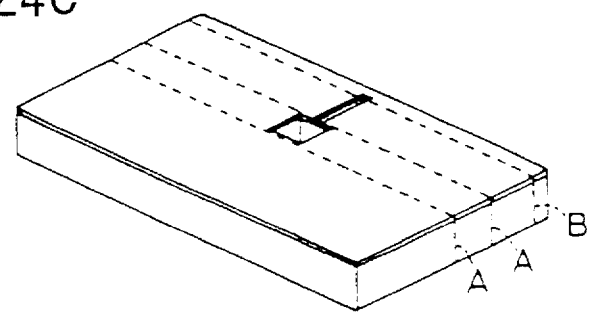

As shown in any of FIGS. 24A–24C, in addition to the feature (1) or (2), the common carrier (1) is made of silicon and is subjected to a wet etching process (anisotropic etching) in which a mask formed of a pattern formed by photolithograph technology is used. By the etching process, the optical component guiding groove (11) and beam passing grooves (17, 171) having a V-shaped cross-section are formed on the common carrier (1). Thereafter, belt-shaped grooves (18, 181) are mechanically formed by he mechanical grinding process.

Feature (4)

As shown in any of FIGS. 9A–9D through 22A–22C, FIGS. 27A–27B through 39A–39C, and 41A–41B through 48, the chip-shaped first optical component (2, 2a, 2b, 2c) and the spherically-shaped or cylindrically-shaped second optical component are aligned so that the optical axes thereof are aligned. The light beam is formed in the direction connecting the first and second components together and along the extension thereof.

In this case, the first optical component (2, 2a, 2b, 2c) is mounted on the first carrier (1, 100, 110), and the second optical component (3, 3a, 3b, 3c) is mounted on the second carrier (120, 200, 1b). The first and second carriers are relatively positioned so that a space for passing the light beam can be ensured. In this manner, it is possible to align the optical axis of the first optical component (2, 2a, 2b, 2c) mounted on the first carrier (1, 100, 110) and the optical axis of the second optical component (3, 3a, 3b, 3c) mounted on the second carrier (120, 200, 1b).

Feature (5)

As shown in any of FIGS. 9A–9D, 10, 15A–15B, 16 through 22A–22C, and 27A–27B through 42A–42B, in addition to the feature (4), the first carrier (110) and the second carrier (120, 1b) are arranged in the plane parallel to the main surfaces of the carriers.

Feature (6)

As shown in any of FIGS. 11A–11B, 14, 43A–43B through 48, in addition to the feature (4), the first carrier (100) and the second carrier (200) are arranged so that the main surfaces thereof face each other.

Feature (7)

As shown in any of FIGS. 9A–9D through 14, 39A–39C, 43A–43B through 48, in addition to the feature (5) or feature (6), a beam passing groove (107, 207) for ensuring a space for passing the light beam is formed on the main surface of either the first carrier (100) or the second carrier (200) along the optical axis by means of an etching process, the mechanical grinding process or a combination thereof.

Feature (8)

As shown in FIGS. 17A–17C, 27A–27B and 28A–28C, in addition to the feature (4) or (5), the chip-shaped first optical component (2) mounted on the first carrier and the spherical or cylindrical second optical component (3) mounted on the second carrier are arranged so that the optical axes of the components (2) and (3) are aligned. The light beam is formed in the direction connecting the first and second components together and along the extension thereof.

In this case, at least two parallel engagement grooves (19) having a V-shaped cross-section are formed on the common carrier (1). Further, at least two parallel engagement grooves (119) having a V-shaped cross-section and arranged at the same pitch as the grooves (19) are formed on the first carrier (110). The first optical component (2) is mounted on the first carrier so that the optical axis thereof is parallel to the grooves (119). Similarly, at least two parallel engagement grooves (129) having a V-shaped cross-section and arranged at the same pitch as the grooves (19) are formed on the second carrier (120). Further, an optical component guiding groove (121) for accommodating part of the second optical component (3) is provided on the second carrier (120). When the second optical component (3) is engaged with the guiding groove (121), the optical axis of the second component (3) is parallel to the grooves (129) formed on the second carrier (120).

A plurality of cylindrical engagement members (8) for positioning are put between the grooves (19) of the common carrier (1) and the grooves (119) of the first carrier (110) and between the grooves (19) of the common carrier (1) and the grooves (129) of the second carrier (129). Hence, the first carrier (110) and the second carrier (120) are arranged on the common carrier (1) so that the optical axis of the first component (2) and the optical axis of the second component (3) can be aligned.

Feature (9)

In addition to the feature (8), the grooves (119) of the first carrier (110) and those (129) of the second carrier (120) are designed to have different widths. Hence, it is possible to obtain the different heights of the first and second carriers (110, 120) on the common carrier (1) so that the optical axis of the first component (2) and the optical axis of the second component (3) can be aligned.

Feature (10)

As shown in FIGS. 18A–18C and 29, in addition to the feature (8), first cylindrical engagement members (81) for positioning are put between the grooves (19) of the common carrier (1) and the grooves (119) of the first carrier (110). Similarly, second cylindrical engagement members (82) for positioning are put between the grooves (19) of the common carrier (1) and the grooves (129) of the second carrier (120). The first cylindrical members (81) and the second cylindrical members (82) are designed to have different diameters. Hence, the first carrier (110) and the second carrier (120) have different heights on the common carrier (1), so that the optical axis of the first component (2) and the optical axis of the second component (3) can be aligned.

Feature (11)

As shown in FIGS. 19A–19C, in addition to the feature (4) or (5), the chip-shaped first optical component (2) mounted on the first carrier and the spherical or cylindrical second optical component (3) mounted on the second carrier are arranged so that the optical axes of the components (2) and (3) are aligned. The light beam is formed in the direction connecting the first and second components together and along the extension thereof.

In this case, at least two sets of engagement means for positioning are formed on the common carrier (1). Each of the sets includes four engagement grooves (191, 192) for positioning that are formed on the common carrier (1) and located at corner portions of an imaginary rectangular area on the carrier (1). Alternatively, each of the sets includes three engagement grooves (191, 192) for positioning that are formed on the common carrier (1) and located at corner portions of an imaginary triangular areas on the carrier (1). The grooves (191, 192) have a counter-pyramidal shape.

The first carrier (110) has four engagement grooves (119A) located at positions corresponding to the corner portions of the imaginary rectangular area on the carrier (1). Alternatively, the first carrier (110) has three engagement grooves (119A) located at positions corresponding to the corner portions of the imaginary triangular area of the carrier (1). The grooves (119A) have a counter-pyramidal shape. The first optical component (2) is mounted on the first carrier (110) so that the optical axis thereof is located further in than at least two sides of the imaginary rectangular area or is located inside of the imaginary triangular area.

The second carrier (120) has four engagement grooves (129A) located at positions corresponding to the corner portions of the imaginary rectangular area on the carrier (1). Alternatively, the second carrier (120) has three engagement grooves (129A) located at positions corresponding to the corner portions of the imaginary triangular area of the carrier (1). The grooves (129A) have a counter-pyramidal shape. The second carrier (120) has an optical component guiding groove (121) which accommodates part of the second optical component and locates the second optical component (3) at a position which is further in than at least two sides of the imaginary rectangular area or a position through which the inside of the imaginary triangular area can be viewed.

A plurality of spherical engagement members (8A) for positioning are put between the grooves of the common carrier (1) and the grooves of the first carrier (110) and between the grooves of the common carrier (1) and the grooves of the second carrier (120). Hence, the first component (2) and the second component (3) face each other so that the optical axes thereof can be aligned.

Feature (12)

In addition to the feature (11), the grooves (119A) of the first carrier (110) and the grooves of the second carrier (120) have different widths so that the first and second carriers (110, 120) have different heights on the common carrier (1). Hence, the first component (2) and the second component (3) face each other so that the optical axes thereof can be aligned.

Feature (13)

In addition to the feature (11), as shown in FIGS. 20A–20C, the spherical engagement members (81A) put between the grooves (191) of the common carrier (1) and the grooves (119A) of the first carrier (110) have a diameter different from that of the spherical engagement members (82A) put between the 5 grooves (191) of the common carrier (1) and the grooves (129A) of the second carrier (120). Hence, the first and second carriers (110, 120) have different heights on the common carrier (1) and thus the optical axes thereof can be aligned.

Feature (14)

Figure 30A:
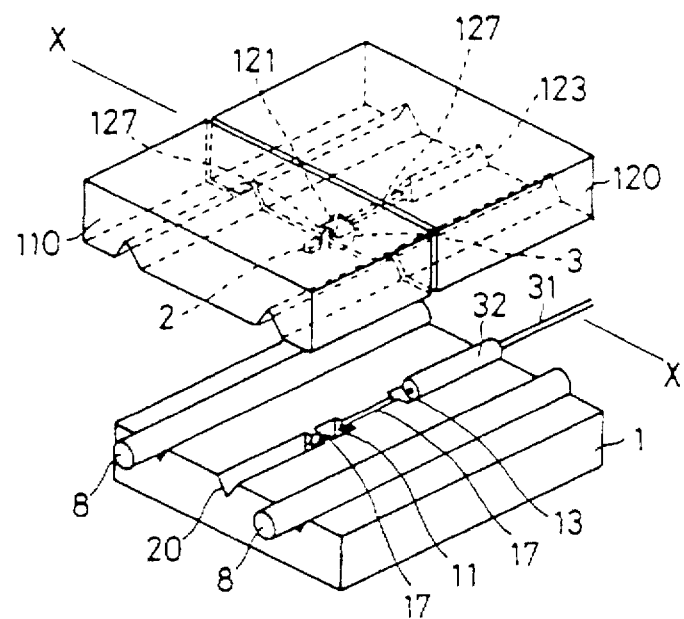
FIGS. 30A, 30B and 30C are diagrams of an optical device according to a fifth embodiment of the present invention.
Figure 30B:
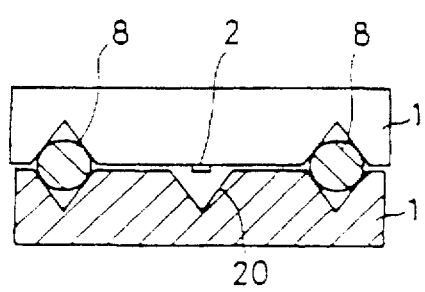
Figure 30C:
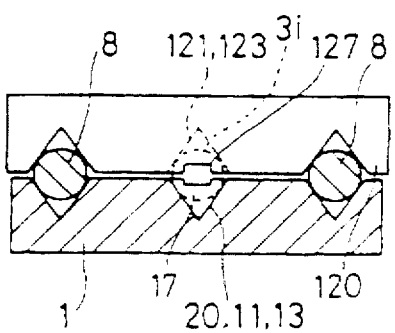

In addition to any of the features (7)–(13), as shown in FIGS. 30A–30C, a beam passing groove (17, 127) is formed, by the mechanical grinding process, on the common carrier (1), or the second carrier (120) or both thereof so that the light beam can travel along the optical axis from one end of the common carrier (1) or the second carrier (120) to the other end thereof.

Feature (15)

In addition to the feature (4) or (5), as shown in FIGS. 21A–21C, 37A–37C, 38A–38C, 39A–39C, 41A–41C and 42A–42B, the chip-shaped first optical component (2) mounted on the first carrier (110, 1) and the spherical or cylindrical second 25 optical component (3) mounted on the second carrier (120, 1b) are aligned so that the optical axes of the components (2) and (3) are aligned. The light beam is formed in the direction connecting the first and second components together and along the extension thereof.

In this case, at least two grooves (119, 19) for positioning the first carrier (110) are formed thereon in parallel to each other. The grooves have a V-shaped cross-section. The first optical component (2) is mounted so that the optical axis thereof is parallel to the parallel grooves (119, 19).

At least two positioning grooves (219) are formed on a first sub-carrier (210) in parallel to each other. The grooves (219), which have a V-shaped cross-section, are arranged at the same pitch as that of the grooves (119, 19) formed on the first carrier (110). The first carrier (110) and the first sub-carrier (210) are stacked so that a first sub-unit (sub-module) can be formed which has engagement member accommodating holes (10) defined by the grooves (119, 19) of the first carrier (110) and the grooves (219) of the first sub-carrier (210).

At least two positioning grooves (129, 19b) for positioning the second carrier (120, 1b) are formed thereon in parallel to each other. The grooves have a V-shaped cross-section. The second carrier (120, 1b) has an optical component guiding groove (121, 11b), which accommodates part of the second optical component (3) so that the optical axis of the second component (3) is parallel to the grooves (129, 19b) of the second carrier. There is provided a second sub-carrier (220) on which at least two positioning grooves (229) having a V-shaped cross-section are formed in parallel to each other. Cylindrical engagement members (8) are put between the grooves (129, 19b) of the second carrier (120, 1b) and the grooves (229) of the second sub-carrier (220) which are stacked, so that a second sub-unit (sub-module) can be formed.

The portions of the cylindrical engagement members (8) protruding from the second sub-unit are inserted into the engagement accommodating holes (10). Thereby, the first carrier (110, 1) and the second carrier (120, 1b) are aligned so that the first component (2) and the second component (3, 3b) face each other and the optical axes thereof are aligned.

Feature 16

In addition to the feature (15), the grooves (119, 19) of the first carrier (110, 1) and the grooves (129, 19b) of the second carrier (120, 1b) have different widths so that the first and second carriers have different heights. Thereby, the first component (2) and the second component (3, 3b) face each other and the optical axes thereof are aligned.

Feature 17

In addition to the feature (7), (15) or (16), as shown in FIGS. 39A–39C, a beam passing groove (127, 227) is formed, by the mechanical grinding process, on the second sub-carrier (220) or the second carrier (120), or both thereof so that the light beam can travel along the optical axis from one end of the second sub-carrier (220) or the second carrier (120) to the other end thereof.

Feature 18

In addition to the feature (7), (14) or (17), the common carrier (1), the second carrier (120) or the second sub-carrier (220) are made of silicon. The positioning grooves (19, 129, 229) are formed by wet etching by the anisotropic etching process in which a pattern formed by photolithograph technology is used as a mask. Then, a beam passing groove (17, 127, 227) is formed by the mechanical grinding process.

Feature (19)

In addition to the feature (4) or (5), as shown in any of FIGS. 22A–22C, 34A–34B, 35A–35B and 36A–36B, the chip-shaped first optical component (2) mounted on the first carrier and the spherical or cylindrical second optical component (3) mounted on the second carrier are aligned so that the optical axes of the components (2) and (3) are aligned. The light beam is formed in the direction connecting the first and second components together and along the extension thereof.

In this case, at least two sets of engagement means are provided on the common carrier (1). Each of the sets of engagement means includes a trapezoidal projection (19p) for positioning or a plurality of trapezoidal projections (19p) arranged in parallel at a predetermined pitch.

At least two sets of engagement means for positioning are provided on the first carrier (110). Each of the sets of engagement means, which should be engaged with a corresponding one of the sets of engagement means of the common carrier (1), includes one positioning groove (119g) which has a V-shaped cross-section, or a plurality of positioning grooves (119g) which have a V-shaped cross-section and are arranged at the same pitch as the projections (19p) of the common carrier (1). The first optical component (2) is mounted on an area between the two sets of engagement means.

At least two sets of engagement means for positioning are provided on the second carrier (120). Each of the sets of engagement means, which should be engaged with a corresponding one of the sets of engagement means of the common carrier (1), includes one positioning groove (129g) which has a V-shaped cross-section, or a plurality of positioning grooves (129g) which have a V-shaped cross-section and are arranged at the same pitch as the projections (19p) of the common carrier (1). Further, the second carrier (120) has an optical component guiding groove (121), which guides part of the second optical component (3). Thereby, the second component (3) can be positioned so that the optical axis thereof is parallel to the positioning grooves (129g).

By engaging the projections (19p) formed on the common carrier (1) with the grooves (119g) formed on the first carrier (110) and the grooves (129g) formed on the second carrier (120), the first carrier (110) and the second carrier (120) are aligned on the common carrier (1). Hence, the first component (2) and the second component (3) face each other so that the optical axes thereof are aligned.

Feature (20)

In addition to the feature (19), the grooves (119g) of the first carrier (110) and the grooves (129g) of the second carrier (120) have different widths. Thereby, the first carrier (110) and the second carrier (120) have different heights on the common carrier (1) so that the optical axes of the first component (2) and the second component (3) are aligned.

Feature (21)

In addition to any of the features (8)–(20), as shown in FIGS. 30A–30C and 39A–39C, a beam passing groove (127) is formed, by the mechanical grinding process, on the second carrier (120) so that the light beam travels along the optical axis from one side of the second carrier to the other side thereof.

Feature (22)

Figure 43A:
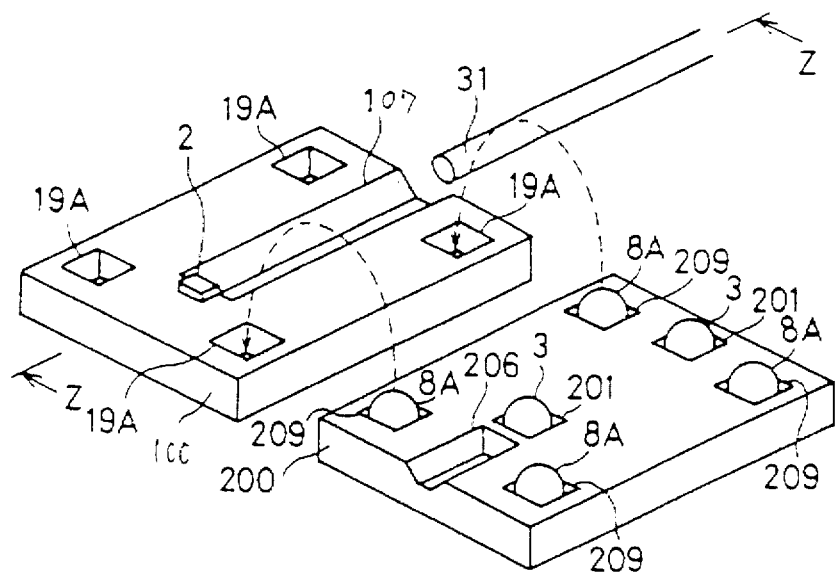
FIGS. 43A and 43B are diagrams of an optical device according to a sixteenth embodiment of the present invention.
Figure 43B:
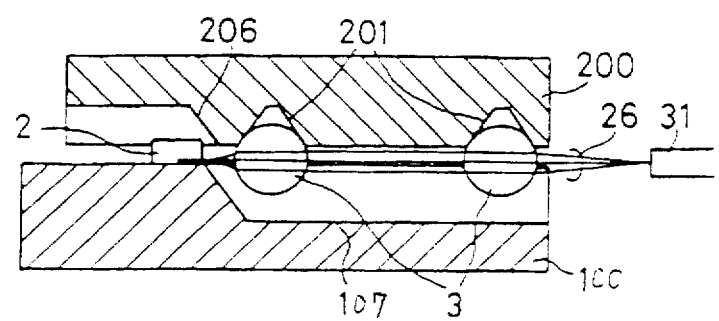
Figure 48:
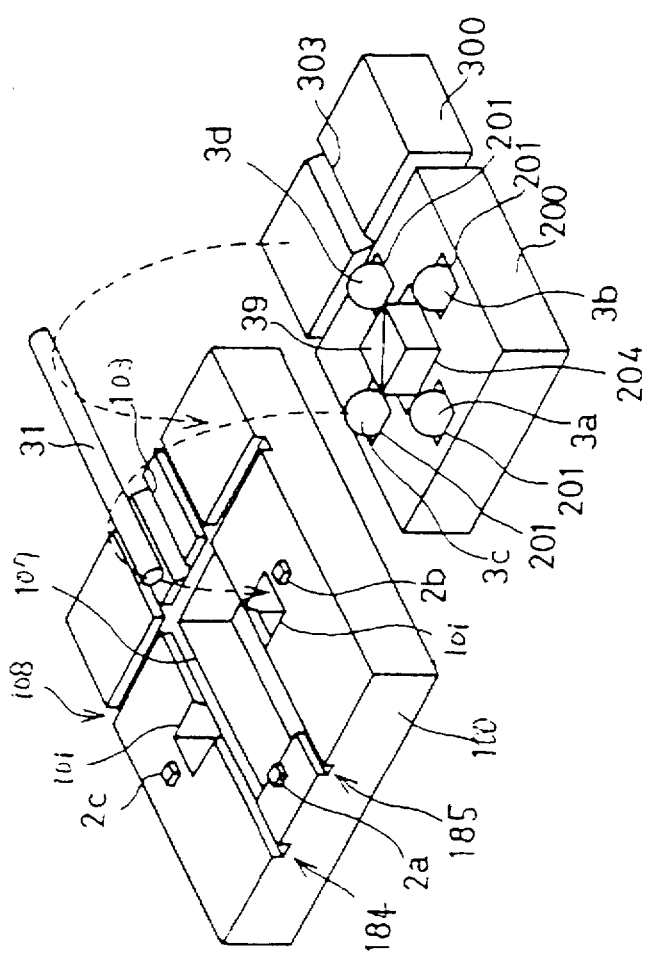
FIG. 48 is a diagram of an optical device according to a twenty-first embodiment of the present invention.

In addition to any of the features (4)–(6), as shown in any of FIGS. 43A–43B through 48, the chip-shaped first optical component (2) and the spherical or cylindrical second optical component (3) are mounted on the first carrier (100) so that the optical axes of the components (2) and (3) are aligned. The light beam is formed in the direction connecting the first and second components together and along the extension thereof.

In this case, the first carrier (100) has positioning grooves (19A, 101) having a counter-pyramidal shape. The first optical component (2, 2a, 2b, 2c) is mounted on the first carrier (100) so as to be located above an area surrounded by the grooves (19A, 101). A beam passing groove (107) having a V-shaped or counter-trapezoidal cross-section is formed on the first carrier (100) between the first component (2) and an end of the first carrier (100) and is located so as to include the optical axis of the first component (2, 2a, 2b, 2c).

The second carrier (200) has positioning grooves (209, 201) having a counter-pyramidal shape. In the structure shown in FIG. 48, the grooves 201 function as both the optical component guiding grooves and the second carrier positioning grooves. The grooves (209, 201) are located at positions corresponding to the grooves (19A, 101) of the first carrier (100). The second carrier (200) has an optical component guiding groove (201) located in an area surrounded by the grooves (209, 201). The component guiding groove (201) accommodates part of the second component (3) and positions it.

A plurality of spherical engagement members (8A, 3a3, b, 3c) are put between the grooves (19A, 101) of the first carrier (100) and the grooves (209, 201) of the second carrier (200), so that the first and second carriers are aligned. In the structure shown in FIG. 48, the members 3a, 3b and 3c also function as members for positioning. Hence, the first component (2, 2a, 2b, 2c) and the second component (3, 3a, 3b, 3c) face each other so that the optical axes thereof are aligned.

Feature (23)

Figure 45A:
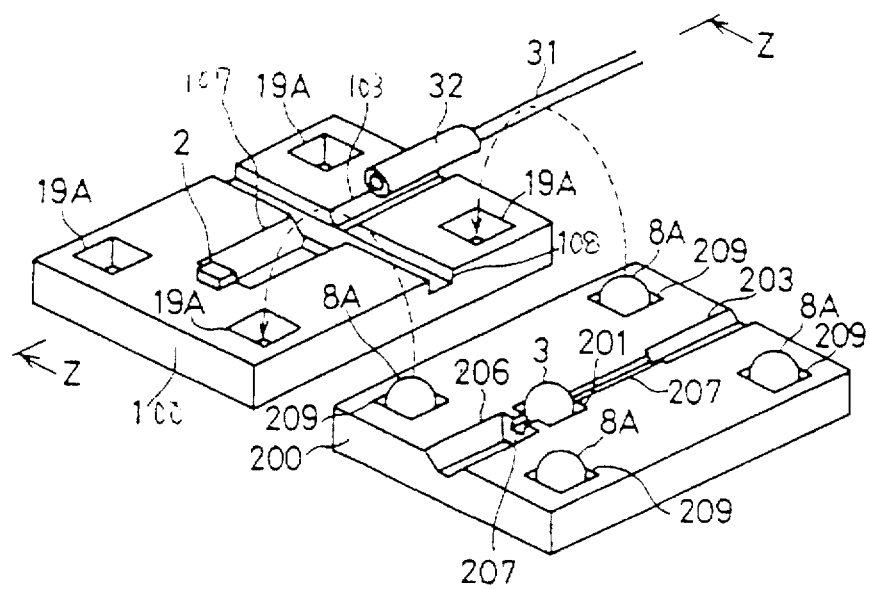
FIGS. 45A and 45B are diagrams of an optical device according to an eighth embodiment of the present invention.
Figure 45B:
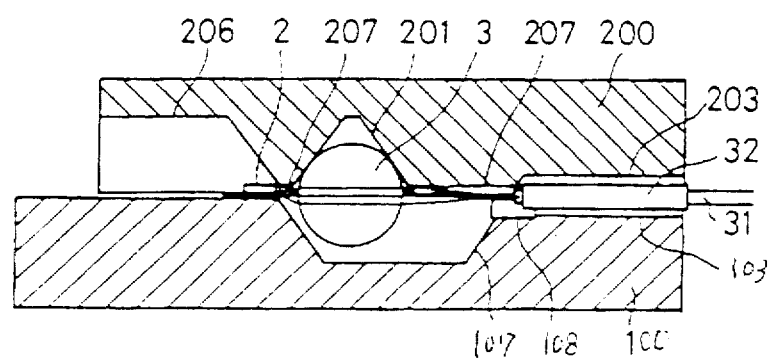

In addition to the feature (22), as shown in FIGS. 45A and 45B, a beam passing groove (207) for ensuring a space for passing the light beam is formed on the second carrier (200) along the optical axis from one end of the second carrier to the other end by means of the mechanical grinding process.

Feature (24)

In addition to the feature (21) or (23), the second carrier (120, 200) is made of silicon, and the grooves (121, 201, 129, 209) are formed by wet etching by the anisotropic etching process in which a pattern formed by photolithograph technology is used as a mask. Thereafter, a beam passing groove (127, 207) is formed by the mechanical grinding process.

Feature (25)

In addition to any of the features (1)–(24), when the second optical component (3) has a spherical shape, the optical component guiding groove (121, 201) has a counter-pyramidal shape. When the second optical component (3) has a cylindrical shape, the optical component guiding groove (121, 201) has a rectangular opening, a V-shaped cross-section in one direction and a counter-trapezoidal shape in another direction perpendicular to the former direction.

A description will now be given of the detail of embodiments of the present invention.

Figure 23A:
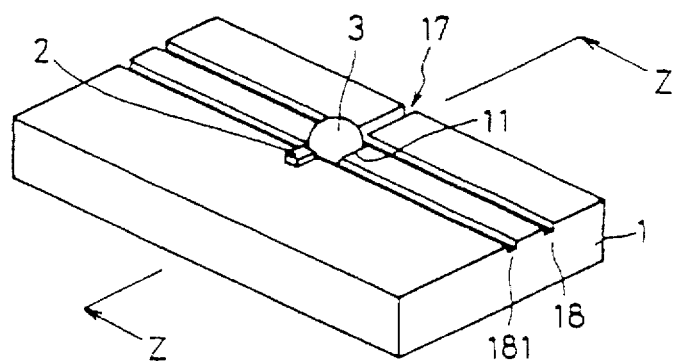
FIGS. 23A and 23B are diagrams of an optical device according to a first embodiment of the present invention.
Figure 23B:
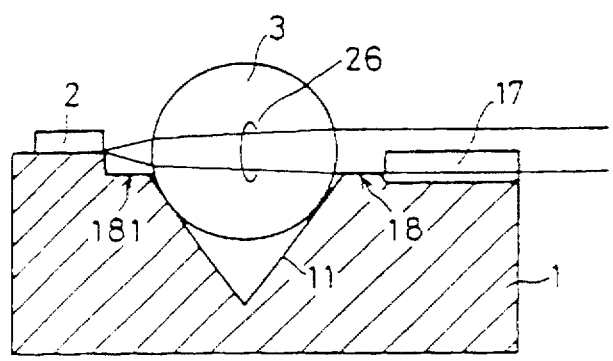

FIGS. 23A and 23B are diagrams of an optical device according to a first embodiment of the present invention. More particularly, FIG. 23A is a perspective view of the optical device, and FIG. 23B is a cross-sectional view taken along line Z—Z shown in FIG. 23A. The carrier 1 is made of silicon and has a main surface having a (100) plane. The guide 11 for guiding the spherical lens 3 is formed on the main surface of the carrier 1. The beam passing groove 17 and belt-shaped grooves 18 and 181 are formed on the main surface of the carrier 1. The semiconductor laser diode chip 2 is mounted on the main surface of the carrier 1. The spherical lens 3 is made of, for example, an optical glass (BK-7) and has a diameter of 0.8 mm. In this case, if the distance between the center of the semiconductor laser diode chip 2 and the center of the lens 3 is set equal to approximately 587 µm, it is possible to form the output beam of the chip 2 into a parallel (collimated) beam. The belt-shaped grooves 18 and 181 are approximately 100 µm in depth and approximately 200 µm in width.

FIGS. 24A, 24B and 24C are respectively perspective views of steps of producing the carrier 1. As shown in FIG. 24A, a mask 7 made of $SiO_2$ is formed on the carrier 1 by a thermal treatment process. Next, windows 71 and 72 are formed in the $SiO_2$ mask 7 by photolithograph technology. Then, as shown in FIG. 24B, the guide groove 11 and the beam passing groove 17 each having a (111) plane are formed by a wet etching using an alkaline etchant. An interval equal to approximately 10 µm is left between the guide 11 and the beam passing groove 17. As shown in FIG. 24C, the belt-shaped grooves 18 and 181 are formed along lines A by a dicing saw. Then, the carrier 1 is cut along line B. Then, the semiconductor laser diode chip 2 and the lens are mounted on the carrier, so that the optical device shown in FIGS. 23A and 23B can be obtained. The spherical lens 3 can be replaced by a cylinder-shaped lens having a refractive index that gradually decreases from the center thereof toward the side surface thereof. In this case, the guiding groove is needed to be of a shape which matches the shape of the cylinder-shaped lens.

Figure 25A:
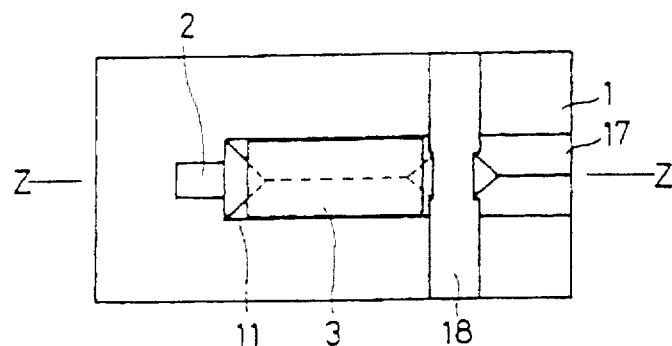
FIGS. 25A, 25B, 25C and 25D are diagrams of a variation of the first embodiment of the present invention.
Figure 25B:
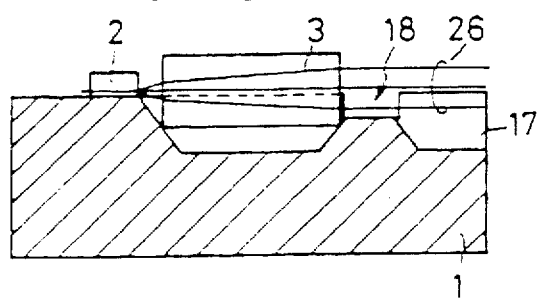
Figure 25C:
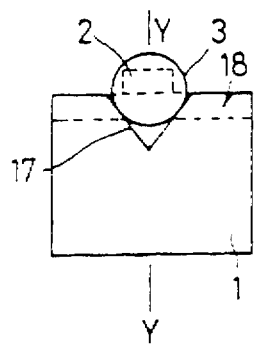
Figure 25D:
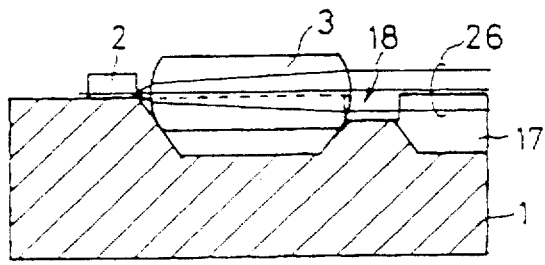

FIGS. 25A through 25D show an optical device according to a variation of the first embodiment of the present invention, in which a cylinder-shaped lens is used. More particularly, FIG. 25A is a plan view of the optical device, and FIG. 25B is a cross-sectional view taken along line Z—Z shown in FIG. 25A. FIG. 25C is a right-hand side view of the optical device, and FIG. 25D is cross-sectional view of a variation of the optical device shown in FIGS. 25A–25C.

The lens 3 is a cylinder-shaped lens which has a diameter of 0.8 mm and is made of glass containing a metal ion. Further, another metal ion is diffused in the glass lens from the side surface thereof so as to obtain the refractive index, the value of which decreases from the center of the lens toward the surface thereof. The cylinder-shaped lens 3 is 2.4 mm long. The guide groove 11 is formed by an anisotropic etching process which uses an opening that is 972 µm wide and 2958 µm long.

When the lens 3 is placed in (engaged with) the groove 11, as shown in FIGS. 25B and 25C, the side surface and the end surfaces of the lens 3 are in contact with the wall surfaces of the groove 11. Hence, the lens 3 is not allowed to freely move in two directions and is definitely positioned. The optical-axis height measured from the main surface of the carrier 1 is 5 µm, and coincides with that of the semiconductor laser diode chip 2. The groove 17 has the same width as the groove 11. The interval between the grooves 11 and 17 before the belt-shaped groove 18 is formed is 10 µm, and the width of the groove 18 is 200 µm.

It is possible to use a cylinder-shaped lens having two end surfaces having a spherical shape, as shown in FIG. 25D. The cylinder-shaped lens 3 shown in FIG. 25D is substituted for the cylinder-shaped lens 3 shown in FIGS. 25A–25D. In the structure shown in FIG. 25D, it is necessary to determine the length of the groove 11 so that the lens 3 can be accommodated therein.

According to the above first embodiment of the present invention and variation thereof, it is possible to provide the optical devices that are laser modules capable of outputting a collimated laser beam. Further, it is possible to simultaneously etch the lens guide and the beam passing groove and thus reduce the time necessary to produce the laser modules. Further, it is possible to precisely form the grooves by anisotropic etching, so that highly precise laser modules can be obtained.

Figure 4A:
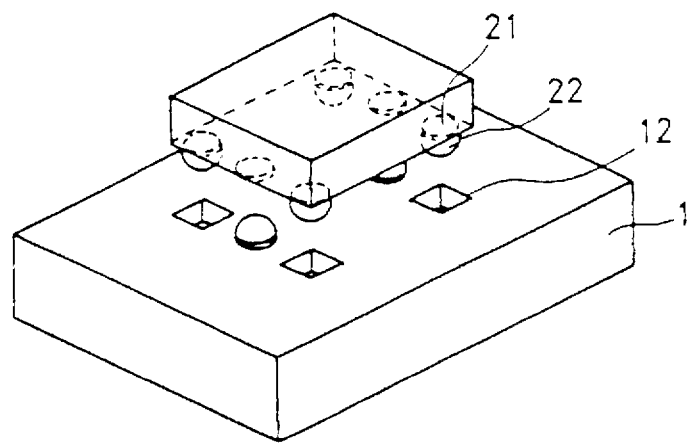
FIGS. 4A and 4B are diagrams showing a first method for mounting a semiconductor laser diode chip on a carrier.
Figure 4B:
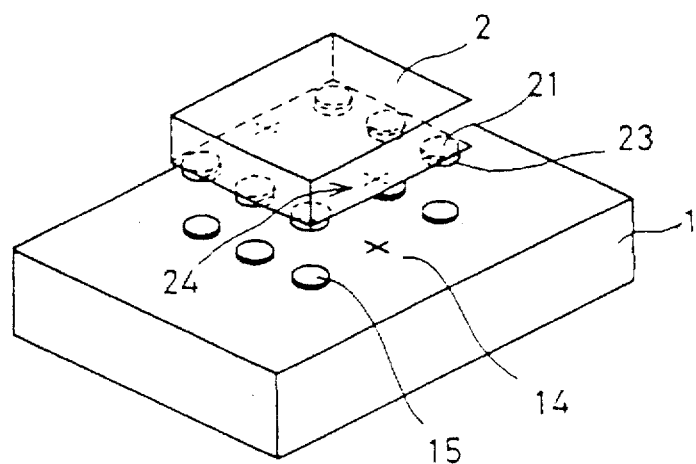
Figure 5A:
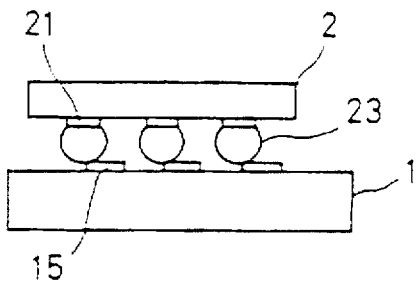
FIGS. 5A, 5B and 5C are diagrams showing a second method for mounting a semiconductor laser diode chip on a carrier.
Figure 5B:
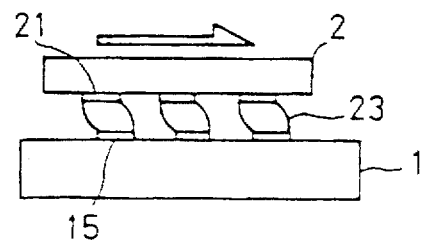
Figure 5C:
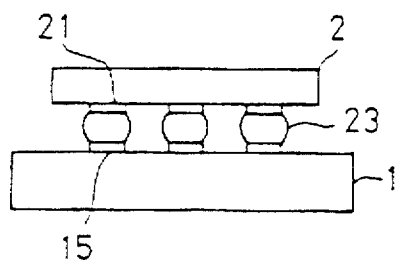
Figure 6:
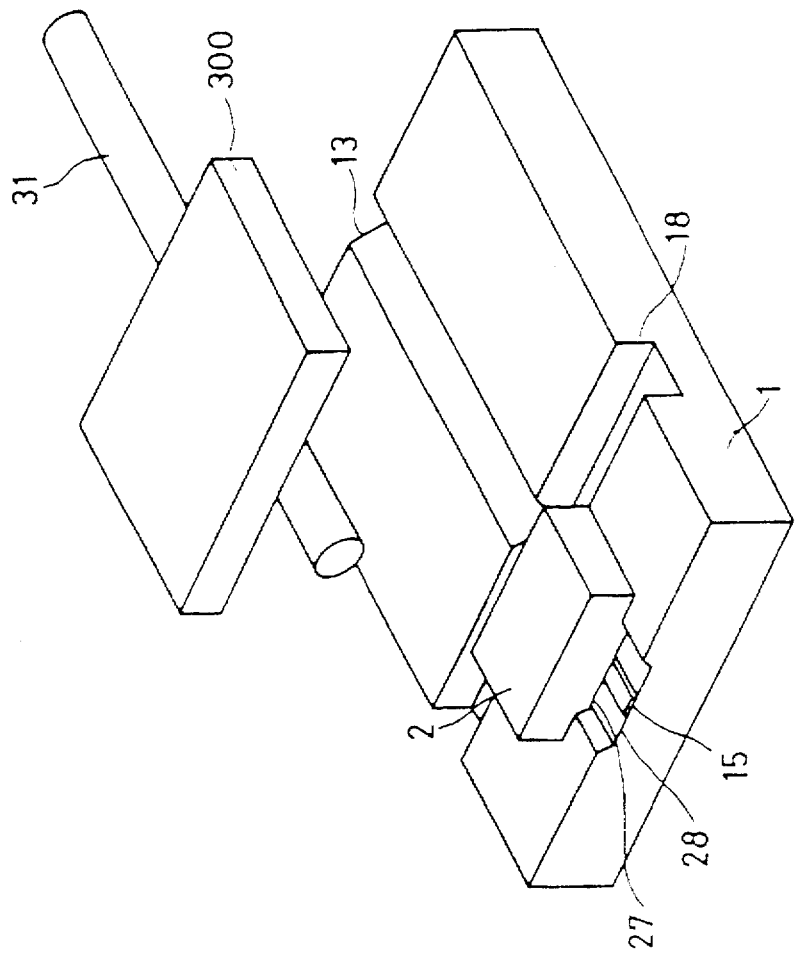
FIG. 6 is a perspective view showing a third method for mounting a semiconductor laser diode chip on a carrier.
Figure 7A:
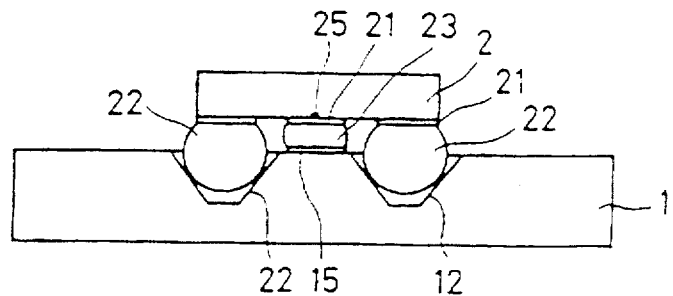
FIGS. 7A, 7B and 7C are diagrams comparatively showing the first, second and third methods.
Figure 7B:
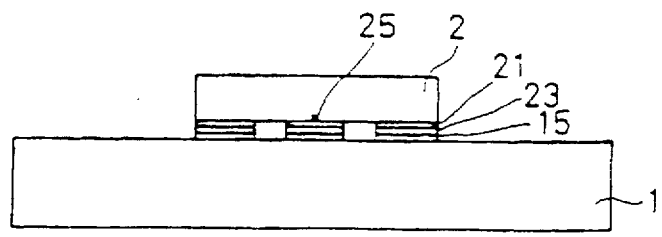
Figure 7C:
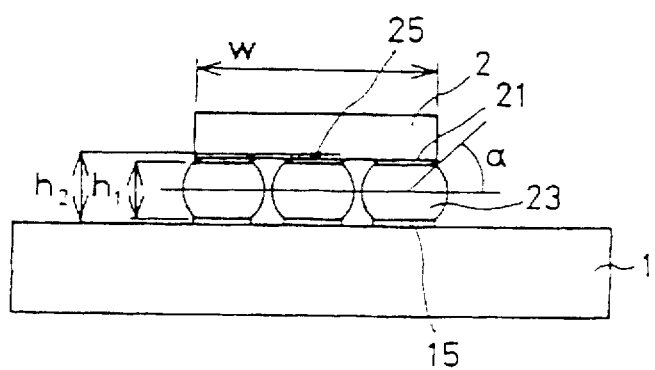

If the laser diode chip 2 is positioned by the means shown in FIGS. 4A–4B through 6, it is possible to precisely position the laser diode chip 2 and the lens 3. The time necessary to produce the module can be reduced because the laser passing groove 17 can be formed only by forming a belt-shaped groove by a dicing saw. It has been confirmed that in the laser modules according to the first embodiment of the present invention and the variations thereof, the output beam is not shaded even if the spot size thereof is increased up to 200 μm.

FIGS. 26A and 26B are diagrams of an optical device according to a second embodiment of the present invention, in which another beam passing groove 171 and belt-shaped groove 182 are formed between the laser diode chip and the lens if the distance between the chip and the lens is long. FIG. 26A shows a first version of the second embodiment of the present invention, and FIG. 26B shows a second version thereof.

An optical device shown in FIG. 26A is a modification of the optical device shown in FIGS. 23A and 23B. More particularly, the device shown in FIGS. 23A and 23B is modified so that the distance of the chip 2 and the lens 3 is increased up to 704 μm so that a light beam 26 is focused and coupled to a single-mode optical fiber 31. An optical device shown in FIG. 26B is obtained by modifying the optical device shown in FIGS. 23A and 23B so that a beam passing groove 171, a fiber guiding groove 13 and a belt-shaped groove 183 are added thereto.

The optical devices shown in FIGS. 26A and 26B may use a cylinder-shaped lens having a refractive index which decreases from the center thereof toward the surface thereof. In this case, the shape of the lens guiding groove is formed so as to match the shape of such a cylinder-shaped lens.

According to the second embodiment of the present invention, it is possible to expand the spot size of the laser beam as much as five times that of the laser beam obtained in the structure shown in FIGS. 23A and 23B. Hence, it becomes possible to provide the single-mode optical fiber 31 at the focusing position and thereby improve the coupling tolerance and coupling efficiency.

Figure 27A:
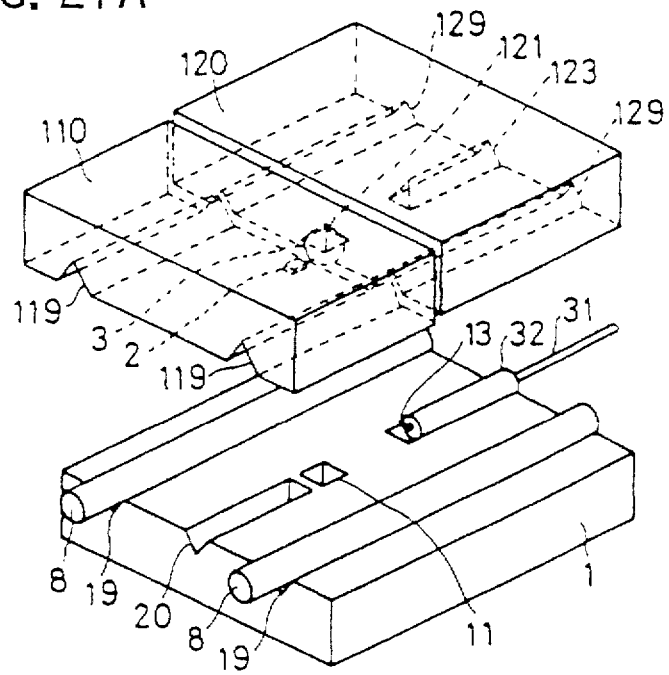
FIGS. 27A and 27B are diagrams of an optical device according to a third embodiment of the present invention.
Figure 27B:
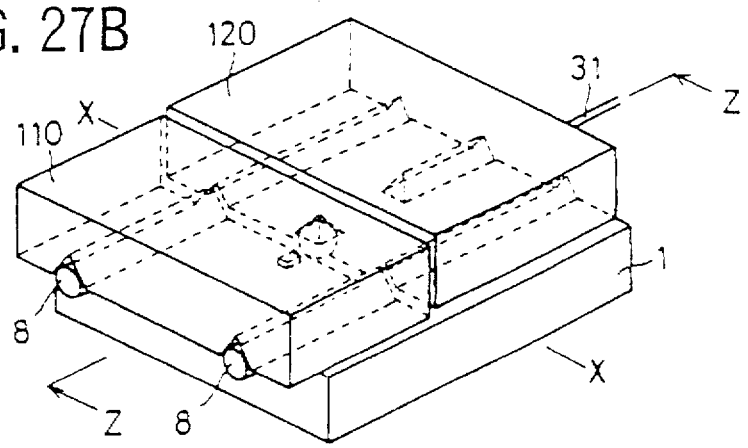

FIGS. 27A and 27B show an optical device according to a third embodiment of the present invention, which uses, in addition to the common carrier, two carriers on which respective optical components are mounted. Particularly, the semiconductor laser diode chip can be mounted so that the optical-axis height thereof can be adjusted. FIG. 27A is an exploded perspective view of the optical device before the two carriers are stacked, and FIG. 27B is a perspective view thereof after stacking the carriers.

As shown in FIG. 27A, the semiconductor laser diode chip 2 is mounted on the first carrier 110, and the lens 3 is mounted on the second carrier 120.

As shown in FIG. 27B, the cylindrical engagement members 8 for positioning are placed in the groove 19 formed on the common carrier 1. Further, the engagement members 8 are engaged with the grooves 119 of the first carrier 110 and the grooves 129 of the second carrier 120. The common carrier 1 has an escaping groove 20 for the chip 2 and wiring, and the optical fiber guiding groove 13. A fiber ferrule 32 for the optical fiber 31 is accommodated in the guiding groove 13. Electrodes for wiring (not shown for the sake of convenience) are formed on the surface of the first carrier 110 in order to supply electricity to the chip 2. The first carrier 110 protrudes from the common carrier 1 in order to facilitate work for connecting the electrodes formed on the first carrier 110 and external electrodes (not shown) together.

The optical device shown in FIGS. 27A and 27B uses the cylindrical engagement members 8, which can be replaced by spherical engagement members as shown in FIGS. 19A–19C and 20A–20C. In this case, the grooves 19, 119 and 129 are of a pyramidal shape having a square or rectangular shaped cross-section.

Figures 28A, 28B:
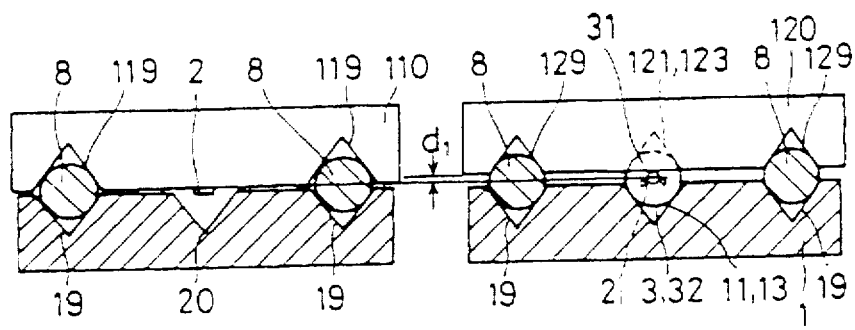
FIGS. 28A, 28B and 28C are cross-sectional views of the optical device according to the third embodiment of the present invention.
Figure 28C:
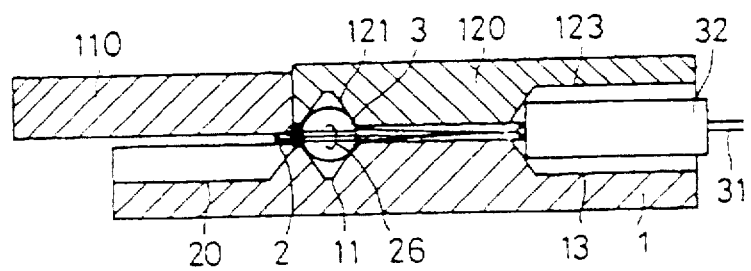

FIGS. 28A–28C show an optical device according to a third embodiment of the present invention. More particularly, FIGS. 28A and 28B are cross-sectional views taken lines parallel to line X—X shown in FIG. 27B, and FIG. 28C is a cross-sectional view taken along line Z—Z. A reference 2$i$ shown in FIG. 28B indicates an imaginary position of the chip 2.

In the third embodiment of the present invention, the width of the grooves 129 is less than that of the grooves 119, so that the second carrier 120 is $d_1$ higher than the first carrier 110 and a sufficient space for passing the light beam is provided between the second carrier 120 and the common carrier 1. For example, the openings of the grooves 19, 129, 11, 13, 121 and 123 are respectively 838 μm, and the groove 119 is 973 μm wide. The diameters of the engagement members 8, the lens 3 and the fiber ferrule 32 are 0.8 mm. In this case, the distance $d_1$ is approximately 100 μm. The distance between the common carrier 1 and the optical axis is approximately 100 μm, and therefore a space equal to approximately 200 μm can be ensured between the common carrier 1 and the second carrier 120.

It is possible to vary the distance between the carrier 1 and the second carrier 120 by adjusting the width of the groove 19, the width of the groove 119, the width of the groove 129 and/or the diameter of the engagement members 8. The distance $d_f$, which is the relative difference between the height of the first carrier 110 and that of the second carrier 120, can be adjusted by the widths of the grooves 119 and 129.

Figure 29:
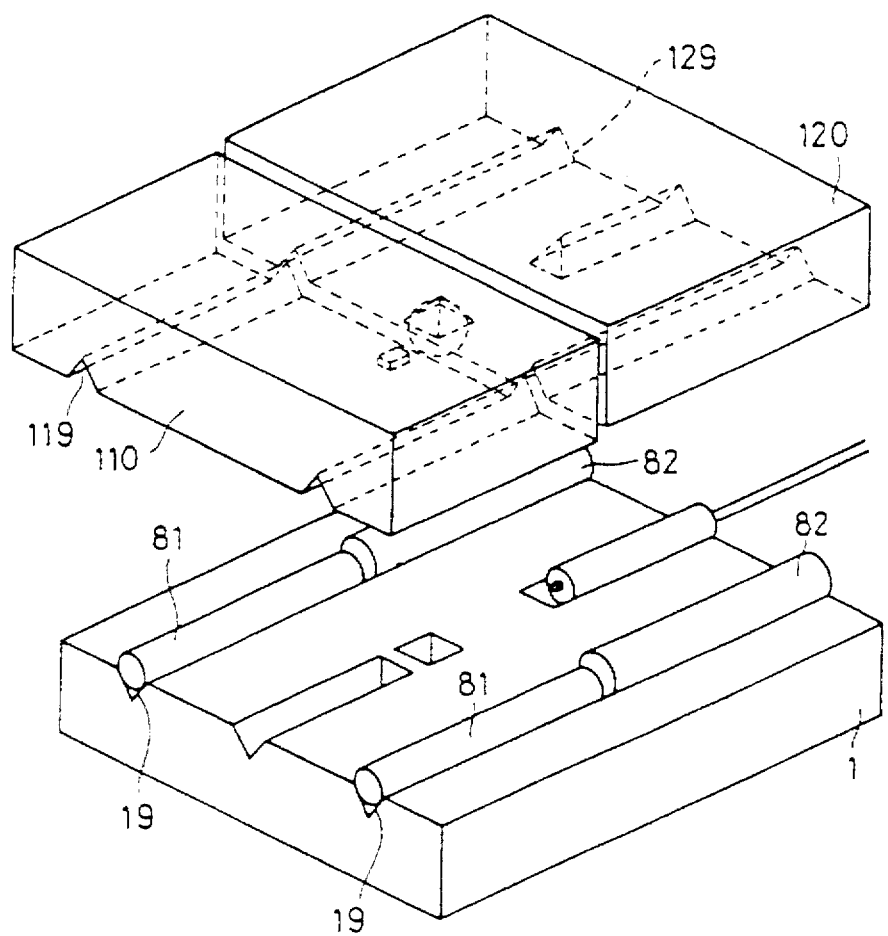
FIG. 29 is a diagram of an optical device according to a fourth embodiment of the present invention.

FIG. 29 is an exploded perspective view of an optical device according to a fourth embodiment of the present invention. The optical components are mounted on at least two carriers on which the optical components should be mounted. Further, the fourth embodiment of the present invention includes the function of adjusting the height of the laser diode chip 2.

As shown in FIG. 29, the distance between the upper carriers and the lower carrier can be adjusted by dividing the engagement members for positioning into engagement members 81 and engagement members 82 having mutually different widths. Further, each of the grooves 19 may be divided into two parts having mutually different widths.

As described above, it is possible to adjust the difference $d_1$ between the heights of the carriers 110 and 120 by adjusting the widths of the grooves 19, 119 and 129 or the diameters of the engagement members 8, 81 and 82 or the combination thereof.

The inventors are aware of prior art disclosed in Japanese Laid-Open Patent Application No. 55-45051. The disclosure of this application relates to coupling between optical fibers, that is, coupling between optical components having an identical shape, an identical size and an identical nature. On the other hand, the present invention is directed to coupling between optical components having different shapes, different sizes and different natures. Hence, the problems to be solved by the prior art are quite different from those solved by the present invention. More particularly, the technique to which the present invention relates needs an adjustment of the heights of optical components, while the prior art does not need such an adjustment.

It will be noted that by dividing the carrier on which the optical components should be mounted into parts (for example, first and second carriers), the beam passing grooves can be easily produced by a mechanical process.

FIGS. 30A–30C show an optical device according to a fifth embodiment of the present invention, in which the beam passing grooves are formed by the mechanical process. More particularly, FIG. 30A shows the common carrier 1, the first carrier 110 and the second carrier 120 before assembling, and FIGS. 30B and 30C are cross-sectional views taken along line X—X shown in FIG. 30A in the assembled state. The reference number 3i indicates an imaginary mounting position of the lens 3.

An example of the mechanical process is the dicing saw. The beam passing grooves 17 and 127 are formed on the carriers 1 and 120 by the dicing saw having a disk-shaped sawing component. If the carriers 110 and 120 are integrally joined together, as shown in FIG. 8B, a recess portion will be formed in the surface portion 2X on which the laser diode chip 2 should be mounted. In the embodiments of the present invention, the above problem does not occur because the carrier is divided into a plurality of carriers, as has been described.

Further, the use of the carriers provides the following advantage. For example, if the spherical lens 3 is fixed by a glass having a relatively low melting point, a high reliability of fixing can be obtained. At the time of fixing the lens 3, it is necessary to heat the glass at a temperature as high as 400° C. or higher (see, Proceeding of the 1992 IEICE Fall Conference, 4-235).

The semiconductor laser diode chip and the lens are mounted on the single common carrier. Hence, if the semiconductor laser diode chip is mounted and thereafter the lens is fixed, the laser diode chip may be degraded or detached from the carrier. The present invention does not have the above problem.

FIG. 31 is a cross-sectional view of an optical device according to a sixth embodiment of the present invention, which is packaged so that an optical fiber can be detached. A case 33 for packaging has a screw portion, which is engaged with another screw portion 34. A fiber ferrule 32 is fixed to the case 33 by screw portion 34. Furthermore, the fiber ferrule 32 is engaged with the groove 13 (123) and positioned with high precision so that the light beam from the chip 2 can be coupled to the optical fiber 31. The optical device having the above structure is an optical module device 101.

With the above structure, it is possible to install the module device 101 and then connect the optical fiber cable thereto. Hence, it is possible to eliminate a disadvantage in the prior art in that a long optical fiber cable makes the work of installing the optical device troublesome.

Figure 32:
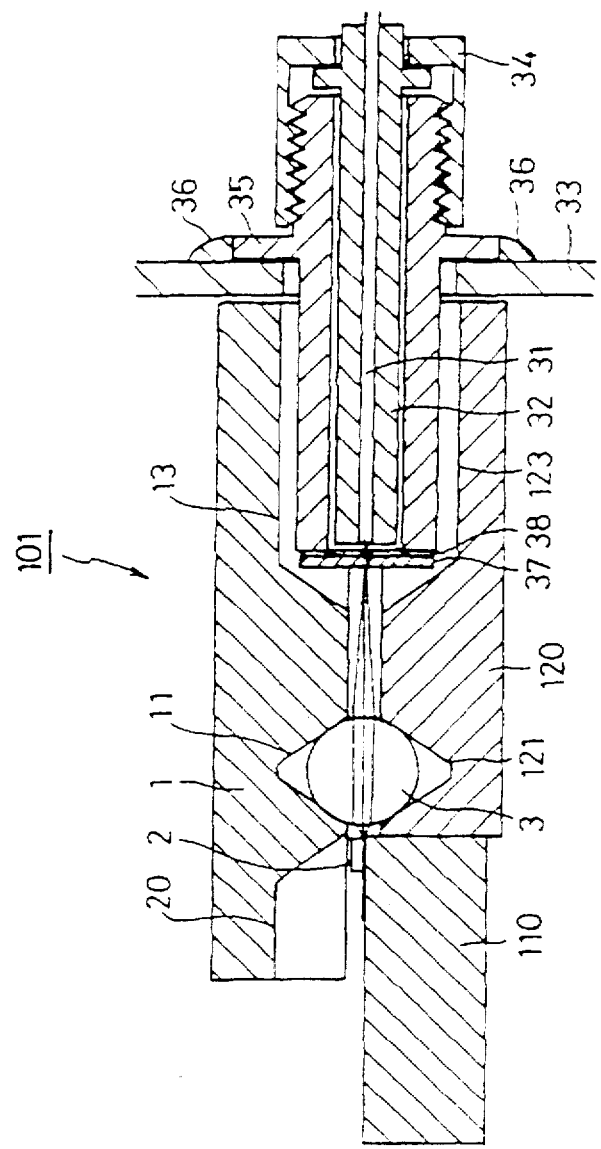
FIG. 32 is a diagram of an optical device according to a seventh embodiment of the present invention.

FIG. 32 is a cross-sectional view of an optical device according to a seventh embodiment of the present invention, which is hermetically sealed packaged so that an optical fiber cable can be detachably connected. As shown in FIG. 32, a hollow cylindrical component 35 having a flange is provided separately from the packaging case 33. An optically transparent plate 37 coated with a metallic film 38 is attached to the leading end of the component 35. The component 35 is welded to the package case 33 by a welding portion 36. The fiber ferrule 32 accommodating the optical fiber 31 is inserted into the cylindrical component 35, and is fixed by the screw portion 34. With the above structure, it is possible to provide the fiber connecting portion which can hermetically seal the semiconductor laser diode chip 2.

Each of the aforementioned embodiments of the present invention has a single semiconductor laser diode chip and a single lens. However, the present invention is not limited to the above, but includes optical devices having a plurality of semiconductor laser diode chips and/or a plurality of lenses and optical devices having a light waveguide path.

Figure 33:
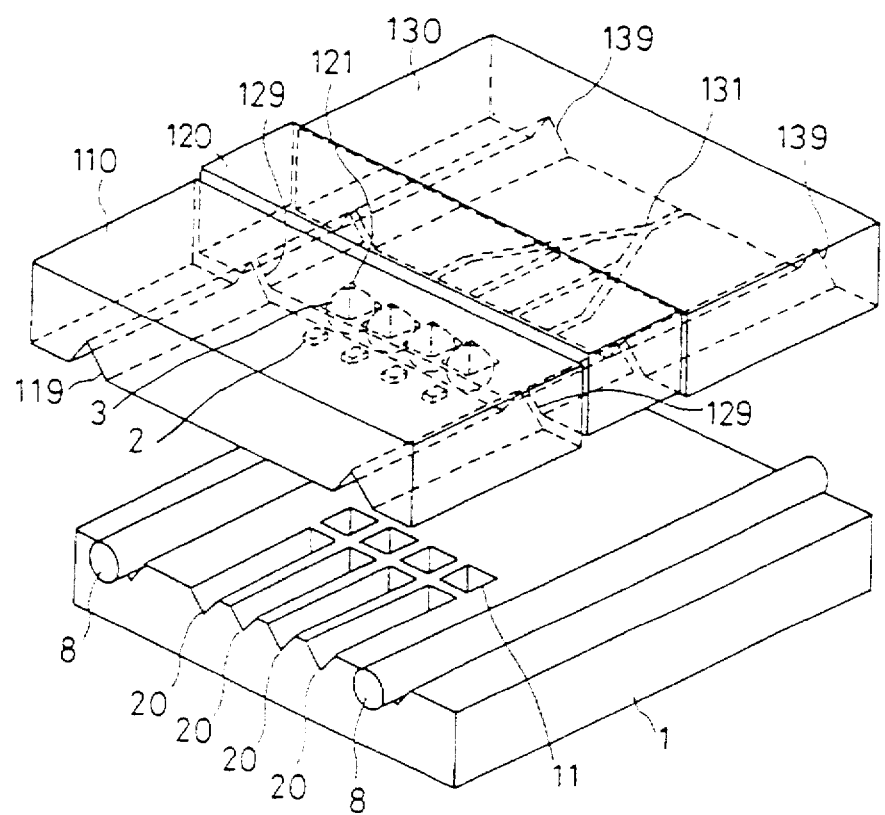
FIG. 33 is a diagram of an optical device according to an eighth embodiment of the present invention.

FIG. 33 is an exploded perspective view of an optical device according to an eighth embodiment of the present invention. The optical device shown in FIG. 33 includes the first carrier 110 on which four semiconductor laser diode chips 2 are mounted, the second carrier 120 on which four lenses 3 are mounted, and a third carrier 130 on which a light waveguide path 131 is formed. The cylindrical engagement members 8 provided on the common carrier 1 are engaged with the positioning grooves 119 formed on the first carrier 110, the positioning grooves 129 formed on the second carrier 120 and the positioning grooves 139 formed on the third carrier 130. With this structure, it is possible to adjust the heights of these carriers and to cause the light beam from the semiconductor laser diode chip 2 to be optically coupled to the light waveguide path 131.

According to the eighth embodiment of the present invention shown in FIG. 33, it is possible to provide a light source module for a wavelength multiplexing communication system, in which a plurality of semiconductor laser diodes having different oscillation wavelengths are used. According to the third through eighth embodiments of the present invention, it is possible to align the first, second and third carriers 110, 120 and 130 by means of an engagement between the projections formed on the common carrier 1 and the grooves formed on the first through third carriers, or an engagement between the grooves formed on the common carrier 1 and the projections formed on the first through third carriers 110–130.

Figure 34A:
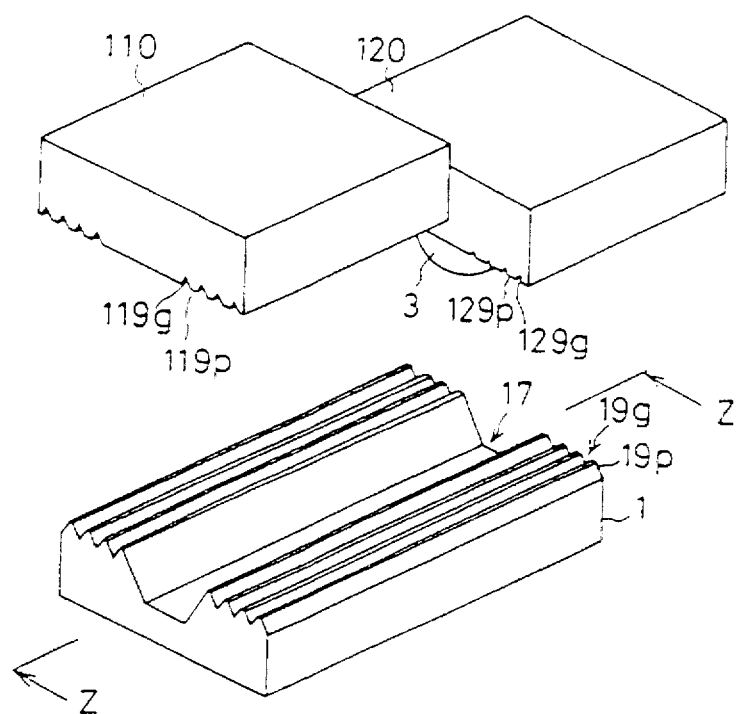
FIGS. 34A and 34B are diagrams of an optical device according to a ninth embodiment of the present invention.
Figure 34B:
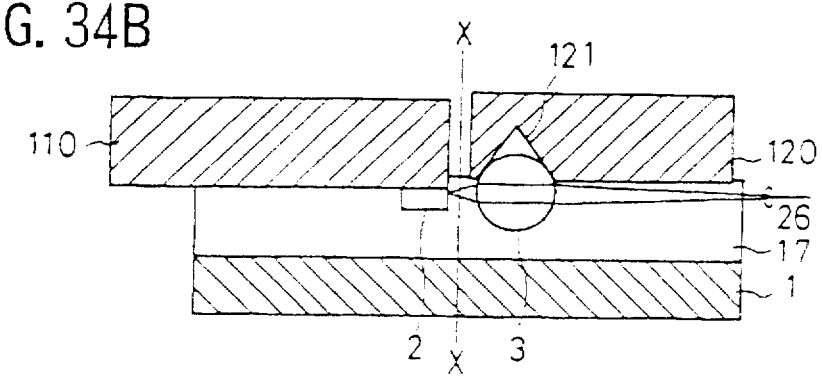

FIGS. 34A and 34B show an optical device according to a ninth embodiment of the present invention. More particularly, FIG. 34A is an exploded perspective view of the optical device before being assembled, and FIG. 34B is a cross-sectional view taken along line Z—Z shown in FIG. 34A in the assembled state. The projections 19p and grooves 19g are periodically arranged on the common carrier 1. The projections 119p and grooves 119g are periodically arranged on the first carrier 110. The projections 129p and grooves 129g are periodically arranged on the second carrier 120. By engaging these projections and grooves with each other as shown in FIG. 34A, it is possible to define the positions of the first and second carriers 110 and 120 in the transverse direction and the heights thereof on the common carrier 1.

Figure 35A:
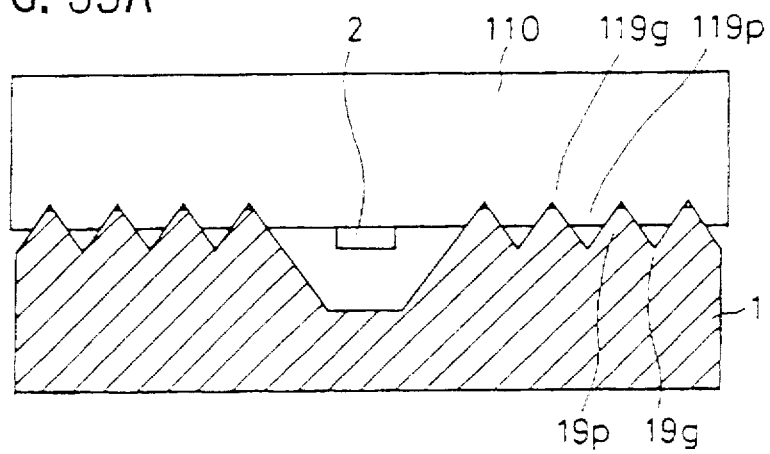
FIGS. 35A and 35B are diagrams of the optical device according to the ninth embodiment of the present invention.
Figure 35B:
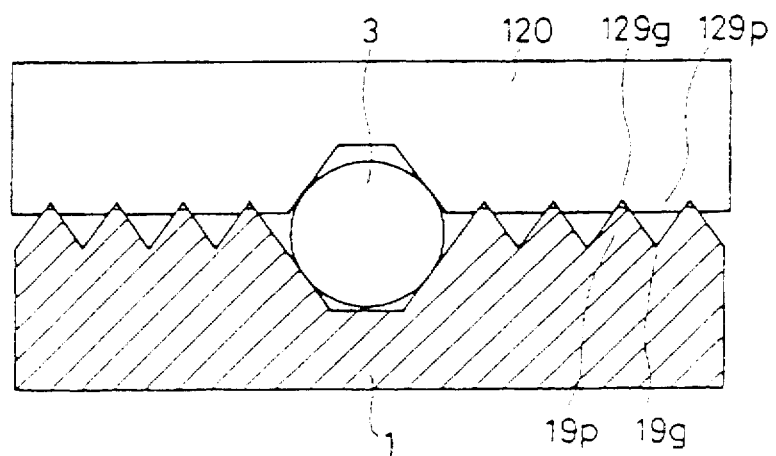

FIGS. 35A and 35B are cross-sectional views of the optical device according to the ninth embodiment of the present invention. More particularly, FIG. 35A is a cross-sectional view taken along a line parallel to line X—X so that the first carrier 110 is included, and FIG. 35B is a cross-sectional view taken along another line parallel to line X—X so that the second carrier 120 is included.

Referring to FIGS. 34A–34B and 35A–35B, the grooves 19g, 119g and 129g are obtained by subjecting the (100)

plane to anisotropic etching. The grooves 19g, 119g and 129g are arranged at a pitch equal to 200 μm, and are respectively 190 μm, 180 μm and 38 μm in width. The projections 19p, 119p and 129p are of a trapezoidal shape. In this case, the difference between the relative heights of the carriers 110 and 120 is equal to approximately 100 μm.

According to the ninth embodiment of the present invention, it is possible to precisely adjust the positions of the carriers 110 and 120 in the transverse direction and the heights thereof. Particularly, the ninth embodiment of the present invention does not need the engagement members for positioning, and therefore the optical device can be easily produced with a reduced cost. Further, the grooves 19g, 119g and 129g are periodically formed, and the precise positioning can be realized even if these grooves are relatively shallow. Furthermore, it is possible to obtain a high mechanical strength of the grooves 19g, 119g and 129g even if the carriers are relatively thin.

Figure 36A:
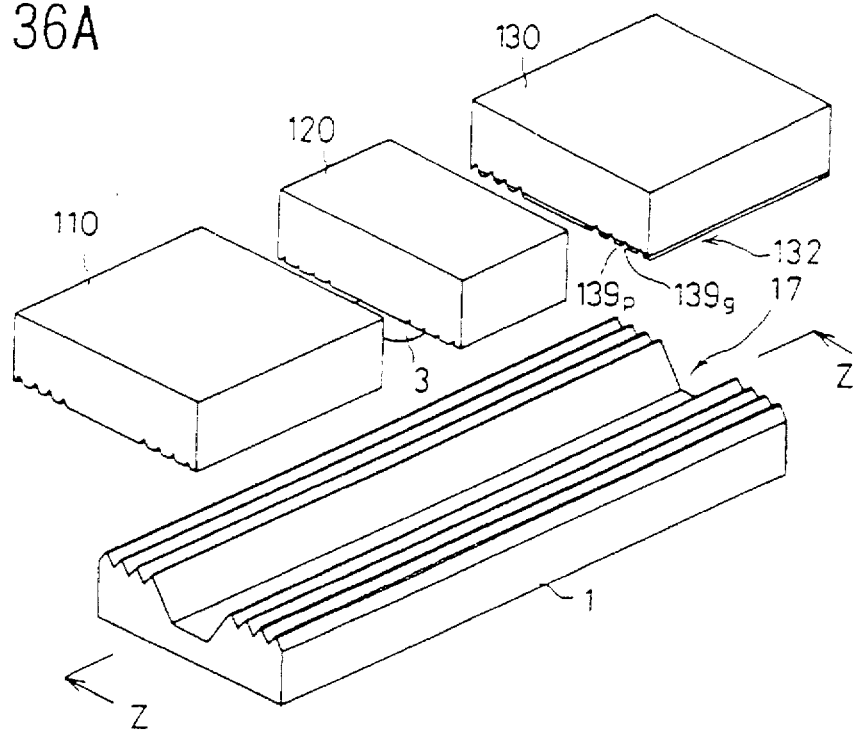
FIGS. 36A and 36B are diagrams of an optical device according to a tenth embodiment of the present invention.
Figure 36B:
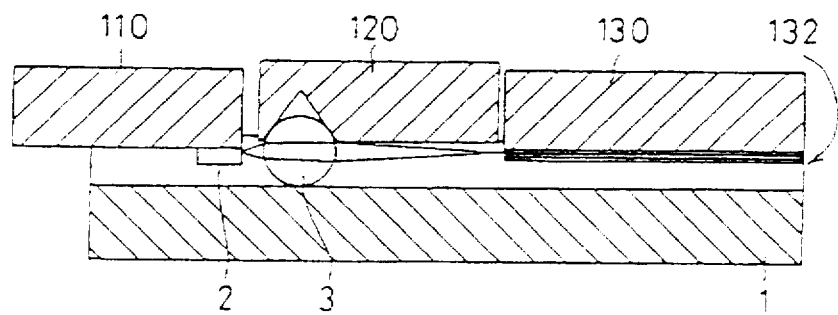

FIGS. 36A and 36B show an optical device according to a tenth embodiment of the present invention. More particularly, FIG. 36A is an exploded perspective view of the optical device before being assembled, and FIG. 36B is a cross-sectional view taken along line Z—Z shown in FIG. 36A in the assembled state. The third carrier 130 formed of silicon has projections 139p and grooves 139g, and a quartz light waveguide path (not show). The first, second and third carriers 110, 120 and 130 are positioned on the common carrier 1 by means of the projections and grooves. A reference number 132 indicates an under cladding layer, a core layer and an over cladding layer, these layers forming the light waveguide path. The grooves 139g on the third carrier 130 are formed by a dicing saw. The above light waveguide path may be formed by diffusing a metallic ion into a glass carrier.

A description will now be given of embodiments of the present invention in which a plurality of independent sub-units, on which optical components should be mounted, are formed and are relatively positioned to make an optical coupling by means of engagement members for positioning.

Figure 37A:
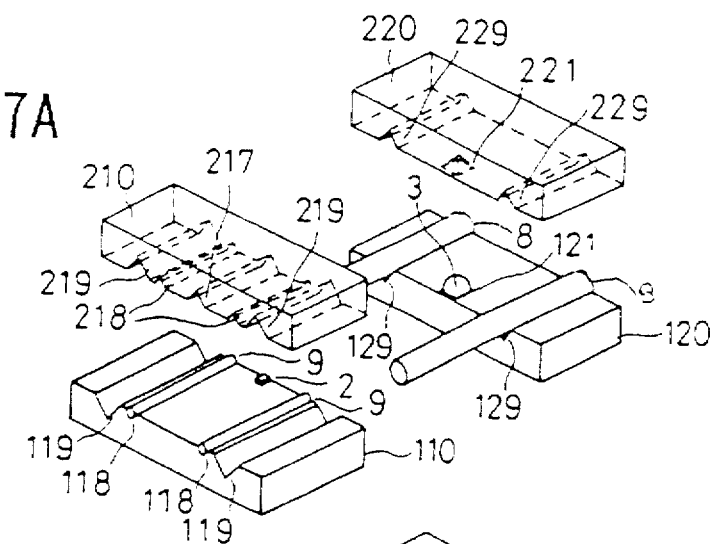
FIGS. 37A, 37B and 37C are diagrams of an optical device according to an eleventh embodiment of the present invention.
Figure 37B:
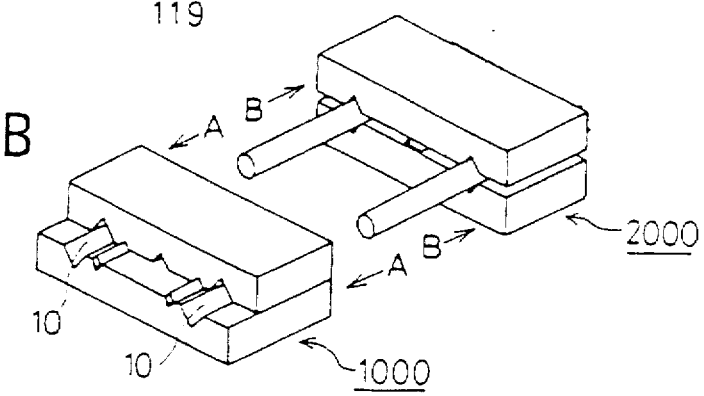
Figure 37C:
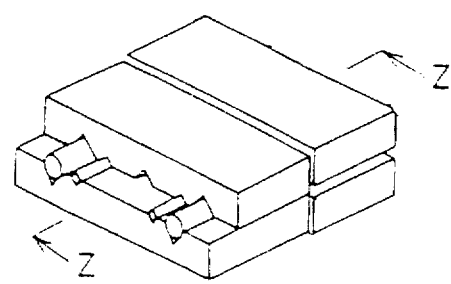

FIGS. 37A, 37B and 37C show an optical device according to an eleventh embodiment of the present invention. More particularly, FIG. 37A is an exploded perspective view of the optical device before which a laser unit and a lens unit are assembled. FIG. 37B is a perspective view of the optical device in which the laser unit and the lens unit are assembled. FIG. 37C is a perspective view of the optical device in which the laser unit and the lens unit are integrated.

The optical device uses the first carrier 110 on which the chip 2 is mounted, and the second carrier 120 on which the lens 3 is mounted. The first and second sub-carriers (engagement carriers) 210 and 220 are respectively combined with the carriers 110 and 120, so that two sub-units are formed.

Referring to FIGS. 37A and 37B, grooves 118 and 119 for positioning are formed on the first carrier 110 by photolithograph technology and anisotropic etching. Similarly, a groove 217 and grooves 218 and 219 for positioning are formed on the first sub-carrier 210 by photolithograph technology and anisotropic etching. Then, the cylindrical engagement members 9 for positioning and the semiconductor laser diode chip 2 are mounted on the first carrier 110, which is stacked with the first sub-carrier 210, so that a first sub-unit 1000 is formed. The first carrier 110 and the first sub-carrier 210 are positioned by engaging the engagement members 9 with the grooves 118 and 218. Similarly, the second carrier 120 and the second sub-carrier 220 are stacked to form a second sub-unit 2000 and are positioned by the grooves 129 and 229.

The sub-unit 1000 has holes 10, which are defined by the grooves 119 and 219 and are used to accommodate the engagement members 8. As shown in FIG. 37C, the first sub-unit 1000 and the second sub-unit 2000 are integrated by the engagement members 8, so that an integrated optical device shown therein can be obtained.

Figure 38A:
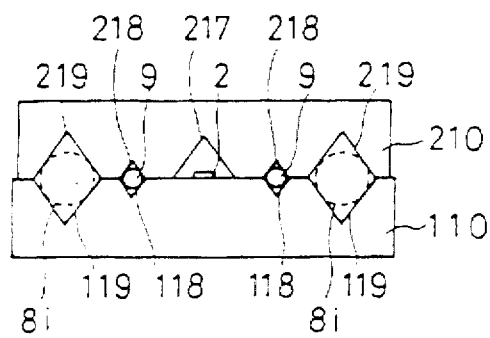
FIGS. 38A, 38B and 38C are diagrams of sub-units used in the optical device according to the eleventh embodiment of the present invention.
Figure 38B:
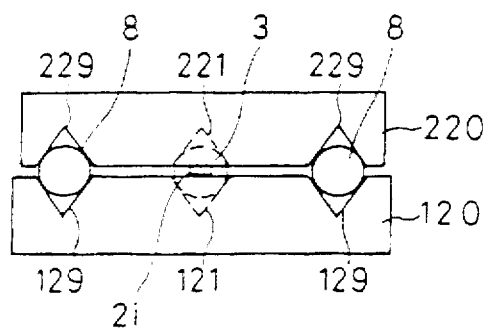
Figure 38C:
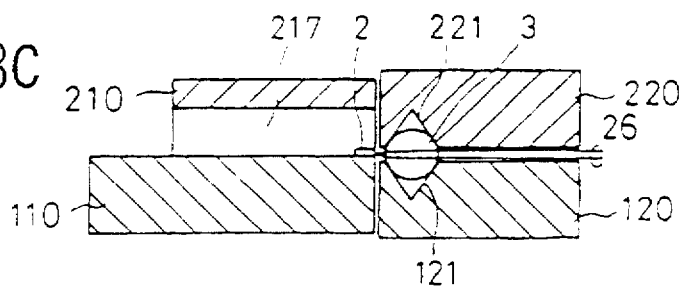

FIGS. 38A, 38B and 38C show the sub-units 1000 and 2000, and more particularly an essential part relating to the adjustment of the heights thereof. More specifically, FIG. 38A is a diagram viewing the first sub-unit 1000 from the direction A shown in FIG. 37B. FIG. 38B is a diagram viewing the second sub-unit 2000 from the direction B shown in FIG. 37B. FIG. 38C is a cross-sectional view taking along line Z—Z shown in FIG. 37C. In FIGS. 38A and 38B, reference numbers 8i and 2i respectively indicate imaginary positions of the engagement members 8 and the chip 2.

As shown in FIGS. 38A and 38B, it is possible to ensure a space through which the laser beam passes by narrowing the widths of the grooves 129 and 229 so as to form an interval between the second carrier 120 and the second sub-carrier 220.

It is possible to form the beam passing grooves on the second carrier 120 and the second sub-carrier 220. In this case, the widths of the grooves 129 and 229 are made equal to those of the grooves 119 and 219. Further, the fiber guiding groove can be provided.

FIGS. 39A–39C show an optical device according to a twelfth embodiment of the present invention, in which the beam passing grooves and fiber guiding grooves are used. More particularly, FIG. 39A is an exploded perspective view of the optical device before being assembled. FIG. 39B is a cross-sectional view taken along a line parallel to line X—X shown in FIG. 39A in which a first sub-module containing the semiconductor laser diode chip 2 is included. FIG. 39C is a cross-sectional view taken along another line parallel to line X—X shown in FIG. 39A wherein a second sub-module containing the lens is included.

The second carrier 120 has the beam passing groove 127, and the first sub-carrier 210 has the beam passing groove 217. The fiber guide groove 123 is formed on the second carrier 120. The figure guide groove 227 is formed on the second sub-carrier 220.

According to the twelfth embodiment of the present invention, it is possible to easily form the beam passing grooves 127 and 227 because the laser diode chip 2 and the lens 3 are mounted on the respective carriers separated from each other. By using the beam passing grooves 127 and 227, it is possible to reduce the distance between the second carrier 120 and the second sub-carrier 220.

According to the twelfth embodiment of the present invention, the two sub-units can be handled like detachable connectors. Hence, if one of the sub-units becomes defective (for example, the laser diode chip 2 becomes defective), it is possible to easily replace the defective sub-unit with a new one. Further, it is possible to easily test the optical device at the assembling step. For example, it is possible to check, at the assembling step, each sub-unit to determine whether each sub-unit has predetermined characteristics and whether the components thereof have a positional deviation. By this step, it is possible to choose sub-units having no defect and improve the yield of producing the optical devices.

Figure 40A:
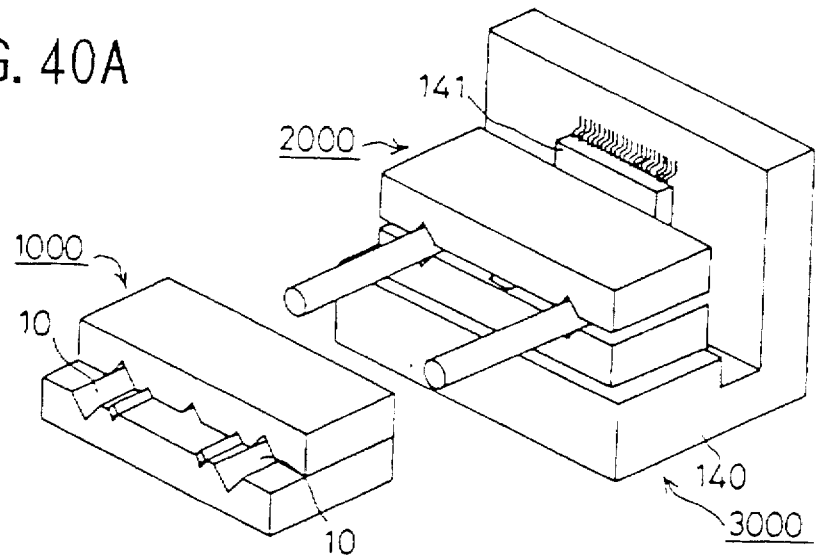
FIGS. 40A and 40B are diagrams of an optical device according to a thirteenth embodiment of the present invention.
Figure 40B:
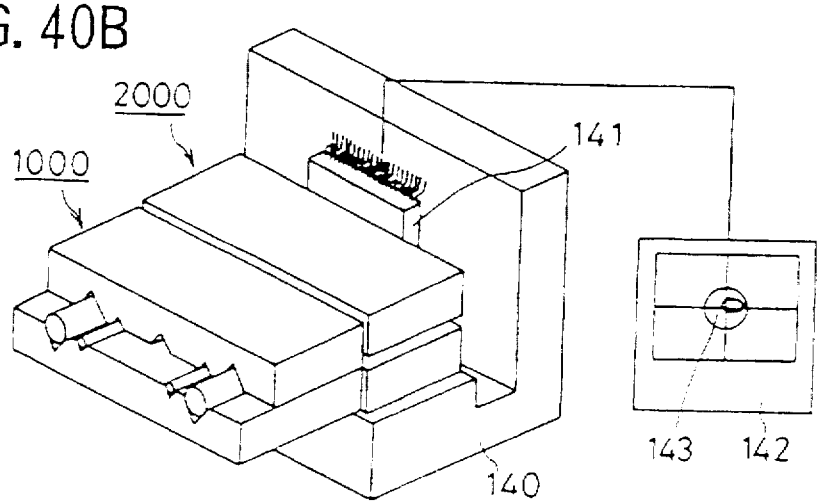

FIGS. 40A and 40B show an optical device according to a thirteenth embodiment of the present invention, wherein a process of testing the sub-unit is illustrated. More particularly, FIG. 40A shows a structure of a test device, and FIG. 40B shows a way to check the sub-unit.

A test device 3000 shown in FIG. 40A is configured so that a block 140 is used to integrate the sub-unit 2000 and an image detector (for example, a CCD image detector) 141. The test device 3000 is used as follows.

First, the engagement members 8 projecting from the second sub-unit 2000 attached to the test device 3000 are inserted into the holes 10 of the first sub-unit 1000. In this state, the laser beam emitted from the light is focused through the lens and is projected onto the image detector 141. An image formed on the image detector 141 is displayed on a monitor device 142. If the spot is located within the predetermined range, it is determined that the first sub-unit 1000 is a good one. If the spot is not located within the predetermined range, it is determined that the sub-unit 1000 is defective and is not used to assemble the optical devices.

In optical devices including semiconductor laser diode chips, it is required to position the chips with the highest precision. The test device shown in FIGS. 40A and 40B makes it possible to choose good sub-units and efficiently improve the yield of the optical devices.

The eleventh and twelfth embodiments of the present invention use two sub-units. However, the present invention includes an optical device having three sub-units or more.

Figure 41A:
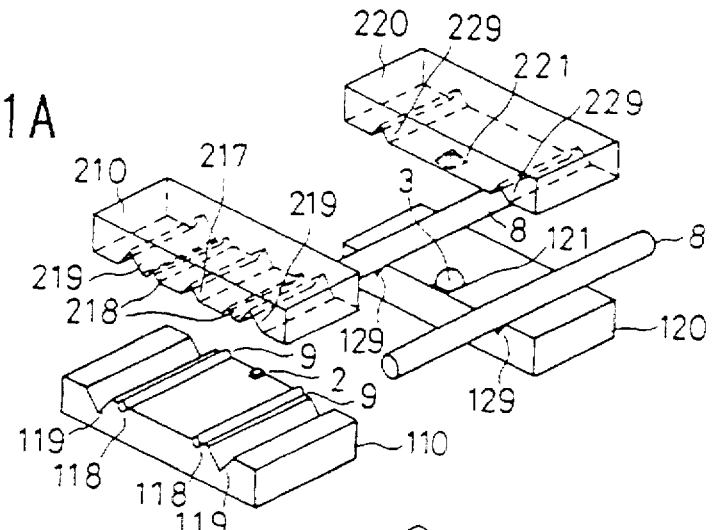
FIGS. 41A, 41B and 41C are diagrams of an optical device according to a fourteenth embodiment of the present invention.
Figure 41B:
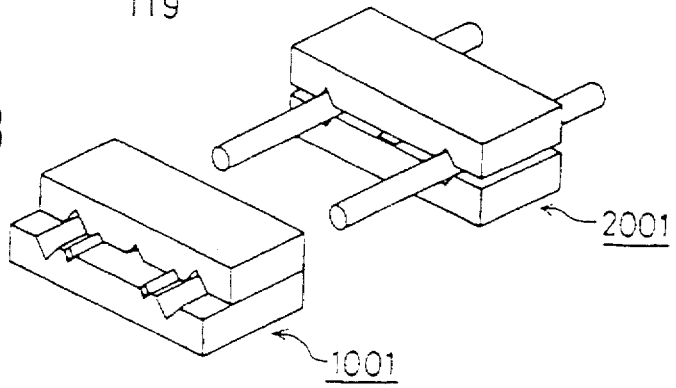
Figure 41C:
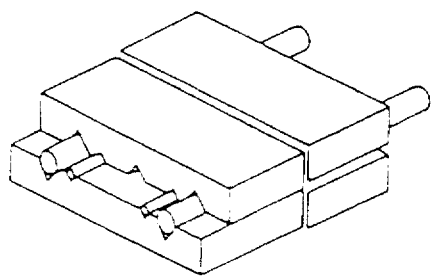

FIGS. 41A-41C show an optical device according to a fourteenth embodiment of the present invention, which has a mechanism of coupling an optical unit to the assembly of the first sub-unit having the semiconductor laser diode chip and the second sub-unit having the lens. More particularly, FIG. 41A is an exploded perspective view of the optical device before being assembled. FIG. 41B shows a first sub-unit 1001 (semiconductor laser unit), and a second sub-unit 2001 (lens unit). FIG. 41C shows an integrated state of the sub-units 1001 and 2001.

As shown in FIGS. 41A-41C, the engagement members 8 of the second sub-unit 2001 are longer than those used in the aforementioned embodiments of the present invention. When the first sub-unit 1001 is joined to the second sub-unit 2001, the engagement members 8 have portions projecting from the second sub-unit 2001, to which another sub-unit can be attached. Hence, it is possible to form a more complex optical device. Further, it is possible to test for each sub-unit and thus improve the yield.

The structures shown in FIGS. 37A-37C, 39A-39B and 41A-41C can be applied to the structures shown in FIGS. 23A-23B, 25A-25D and 26A-26B.

Figure 42A:
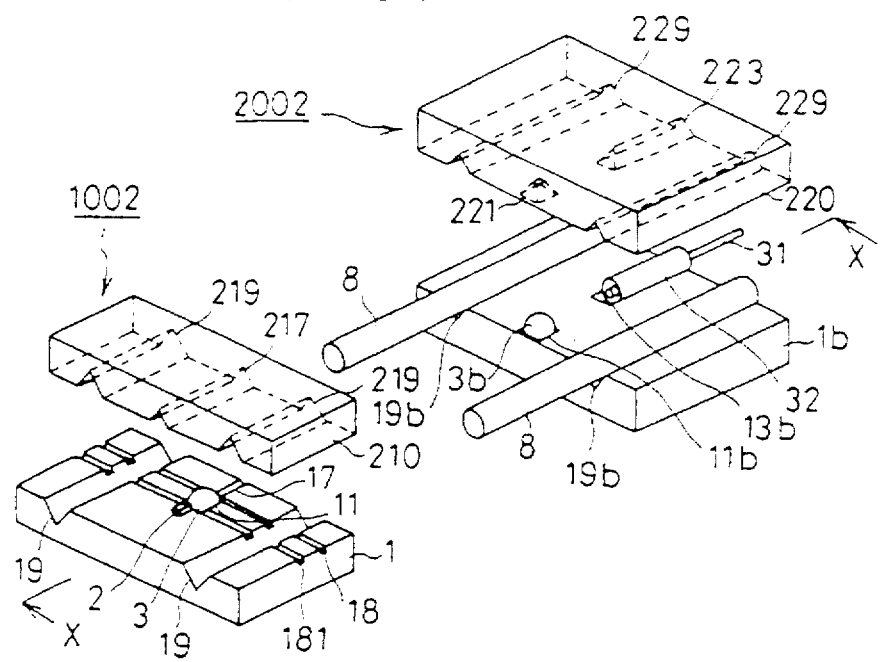
FIGS. 42A and 42B are diagrams of an optical device according to a fifteenth embodiment of the present invention.
Figure 42B:
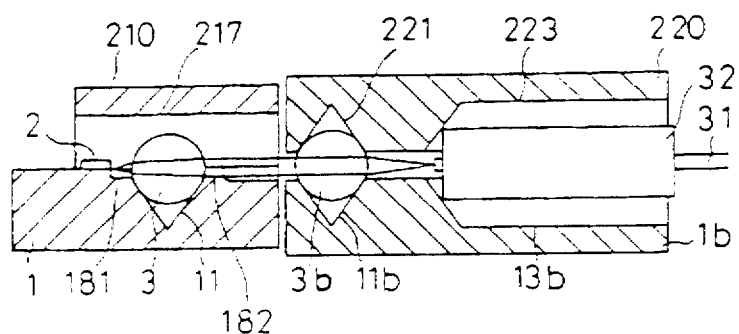

FIGS. 42A and 42B show an optical device according to a fifteenth embodiment of the present invention wherein at least two sub-units are used. More particularly, FIG. 42A is an exploded perspective view of the optical device, and FIG. 42B is a cross-sectional view taken along line X—X shown in FIG. 42A in the assembled state. The fifteenth embodiment of the present invention uses a sub-unit 1002 obtained by combining the sub-carrier 210 with the structure shown in FIGS. 21A-21C, and a sub-unit 2002 obtained by mounting the lens 3b and the optical fiber equipped with the ferrule 32 on a carrier 1b and combining the sub-carrier 220 with the above carrier 1b.

The carrier 1b has grooves 11b, 13b and 19b formed on the main surface thereof. A lens 3b is placed in the groove 11b. The fiber ferrule 32 is placed in the groove 13b. The cylindrical engagement members 8 are placed in the grooves 19b. As shown in FIG. 42B, it is possible to easily ensure a space for passing the light beam and realize an optical coupling with the optical fiber. The output beam from the semiconductor laser diode is collimated in the sub-unit including the carrier 1. Hence, it is possible to easily realize an optical coupling with various optical systems. In short, the structure shown in FIGS. 42A and 42B facilitates systematizing of the optical configuration.

A description will now be given, with reference to FIGS. 43A-43B through 49A-49C, of other ways to combining the first carrier on which the chip is mounted and the second carrier on which the lens is mounted. In these figures, the beam passing groove 107 is formed by anisotropically etching the carrier 100 of silicon.

FIGS. 43A and 43B show an optical device according to a sixteenth embodiment of the present invention. More particularly, FIG. 43A is an exploded perspective view of the optical device, and FIG. 43B is a cross-sectional view taken along line Z—Z shown in FIG. 43A in the assembled state. The semiconductor laser diode chip 2 is mounted on the carrier 100 on which the beam passing groove 107 is formed. The lens 3 is mounted on the carrier 200. In the state in which the carriers 100 and 200 are stacked and positioned, the laser beam emitted from the chip 2 is not shaded. The positioning of the carriers 100 and 200 is realized by grooves 19A formed on the carrier 100, grooves 209 formed on the carrier 200, and spherical engagement members 8A. The lens 3 is positioned by the guide groove 201.

Figure 44A:
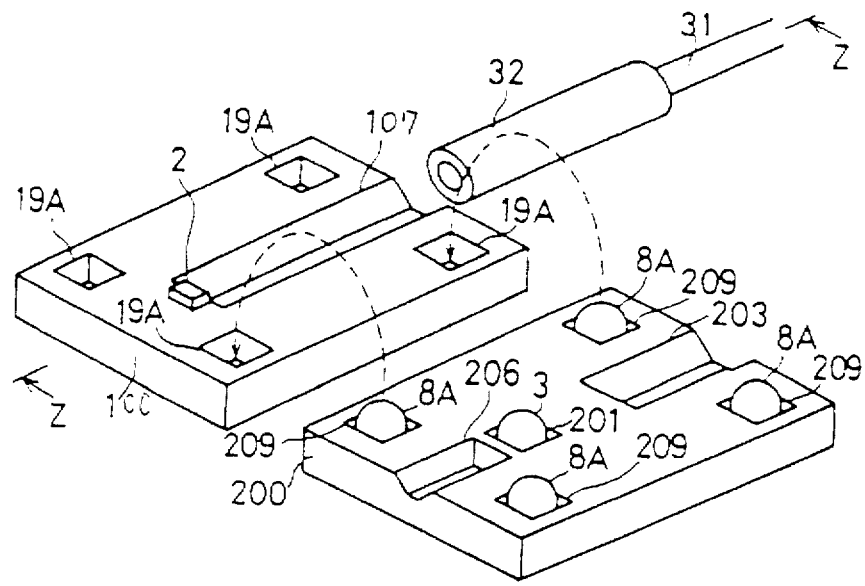
FIGS. 44A and 44B are diagrams of an optical device according to a seventeenth embodiment of the present invention.
Figure 44B:
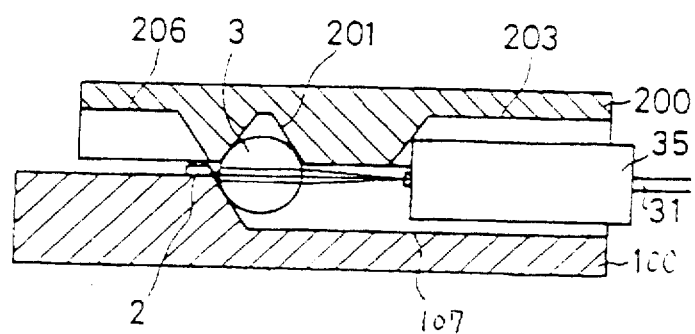

FIGS. 44A and 44B show an optical device according to a seventeenth embodiment of the present invention, which corresponds to a first variation of the structure shown in FIGS. 43A and 43B. More particularly, FIG. 44A is an exploded perspective view of the optical device before being assembled, and FIG. 44B is a cross-sectional view taken along line Z—Z shown in FIG. 44A in the assembled state. A guide groove 203 is formed on the main surface of the carrier 200. The beam passing groove 107 is used to guide the optical fiber 31 equipped with the ferrule 32. Hence, it is possible to simultaneously position the optical fiber 31 and the carriers 100 and 200.

FIGS. 45A and 45B show an optical device according to an eighteenth embodiment of the present invention, which corresponds to a second variation of the structure shown in FIGS. 43A and 43B. More particularly, FIG. 45A is an exploded perspective view of the optical device before being assembled, and FIG. 45B is a cross-sectional view taken along line Z—Z shown in FIG. 45A in the assembled state. On the carrier 100, formed are the beam passing groove 107, the guide 103 and the belt-shaped groove 108 connecting the grooves 107 and 103 together. The beam passing groove 207 is formed on the carrier 200. With the above structure, it is possible to guide the optical fiber with the ferrule 32 even if the ferrule 32 has a relatively small diameter.

Figure 46A:
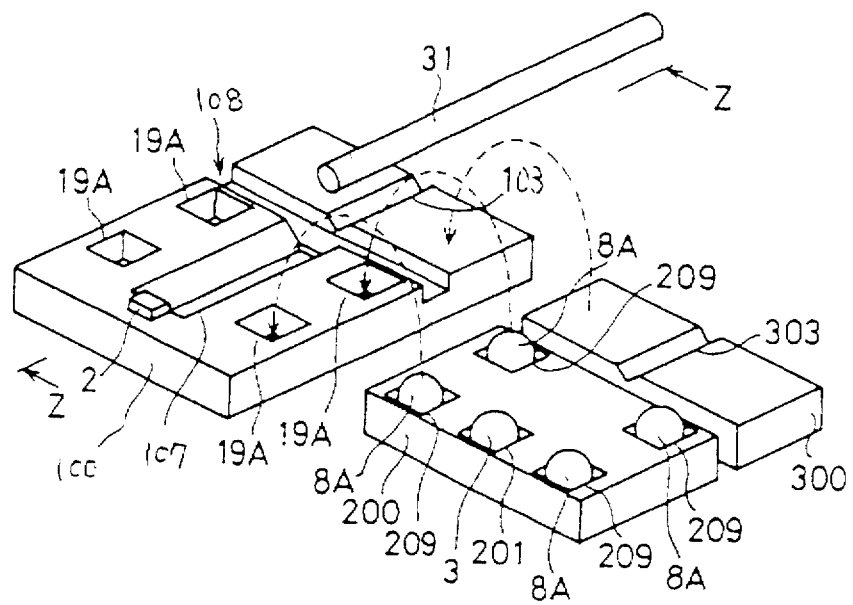
FIGS. 46A and 46B are diagrams of an optical device according to a nineteenth embodiment of the present invention.
Figure 46B:
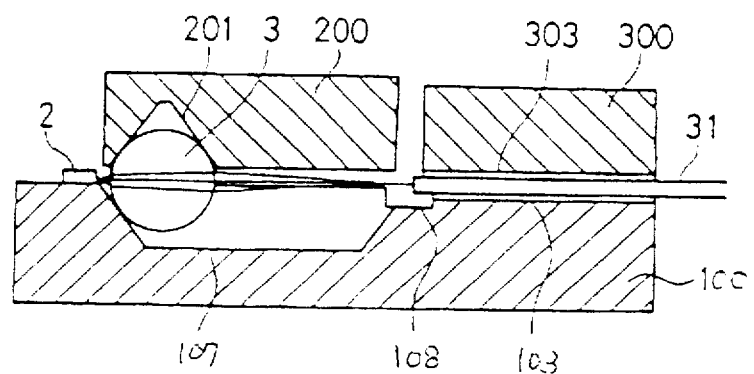

FIGS. 46A and 46B show an optical device according to a ninetieth embodiment of the present invention, which corresponds to a third variation of the structure shown in FIGS. 43A and 43B. More particularly, FIG. 46A is an exploded perspective view of the optical device before being assembled, and FIG. 46B is a cross-sectional view taken along line Z—Z shown in FIG. 46A in the assembled state. The optical device shown in FIGS. 46A and 46B uses an optical fiber holding plate 300, which makes it possible to mount the optical fiber 31 without any ferrule.

In the structures shown in FIGS. 43A-43B through FIGS. 46A-46B, four grooves 19A located at corners of an imaginary rectangle and four grooves 209 located at corners of an imaginary rectangle are used and thus four spherical engagement members 8A are used. However, the present invention is not limited to the above structure, but includes a structure in which the grooves 19A are located at the respective corners of an imaginary polygon having at least three corners (triangle) and the grooves 209 are also located at the corners thereof. The spherical engagement members 8A are engaged with the above grooves 19A and 209. Three grooves formed on each of the carriers 100 and 200 are enough to precisely position the carrier 200. In this case, each of the carriers 100 and 200 is configured so that two grooves are provided on the left side of the optical axis viewing from the chip 2, and one groove is provided on the right side thereof.

It is also possible to use the lens 3 as an engagement member for positioning. In this case, the first groove 19A (209) is located on the right side of the optical axis viewing from the chip 2, and the second groove 19A (209) is located on the left side thereof. The third groove is the groove in which the spherical lens 3 is placed. The two spherical engagement members are placed in the first and second grooves and the spherical lens 3 is placed in the third groove.

Figure 47:
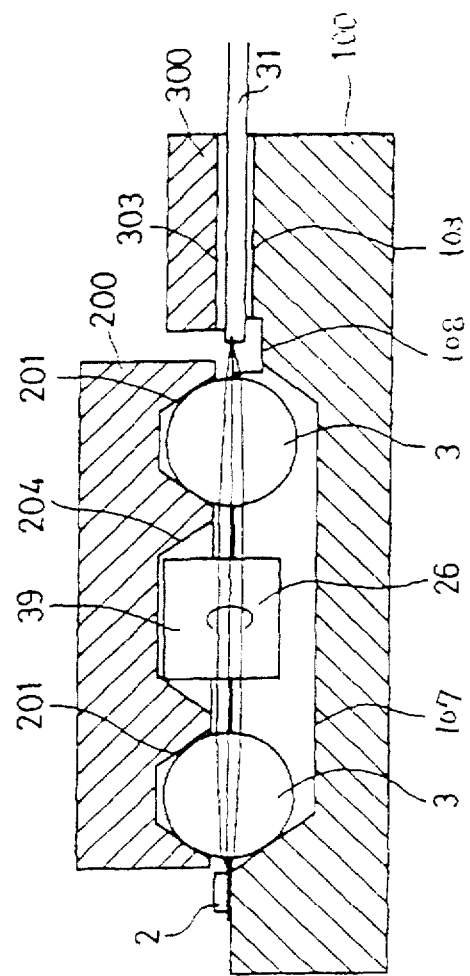
FIG. 47 is a diagram of an optical device according to a twentieth embodiment of the present invention.

FIG. 47 shows an optical device according to a twentieth embodiment of the present invention. A groove 204 in which an optical member 39 can be placed is formed on the carrier 200. By making the lens 3 to collimate the laser beam 26, it is possible to dispose the optical member 39 having a rectangular shape. The optical component 39 is, for example, a reflector, filter or an optical isolator.

FIG. 48 shows an optical device according to a twenty-first embodiment of the present invention. The optical member 39 used in the optical device shown in FIG. 47 is a half-mirror. Part of the light emitted from a light-emitting device 2a such as a semiconductor laser diode chip passes through the lens 3a, the half-mirror 39 and the lens 3band is projected onto the optical component 2b such as a photodetector. The other part of the light emitted from the device 2a passes the lens 3athe half-mirror 39 and the lens 3band enters the optical fiber 31. The light emitted from the optical fiber 31 passes through a lens 3d, the half-mirror 39 and the lens 3c, and enters an optical component 2csuch as a photodetector.

The belt-shaped grooves 108, 184 and 185 are formed by the dicing saw after the lens guide groove 101, 106, 107 and the beam passing groove 107 are formed, and have a width of 200 μm and a depth of 100 μm.

Figure 49A:
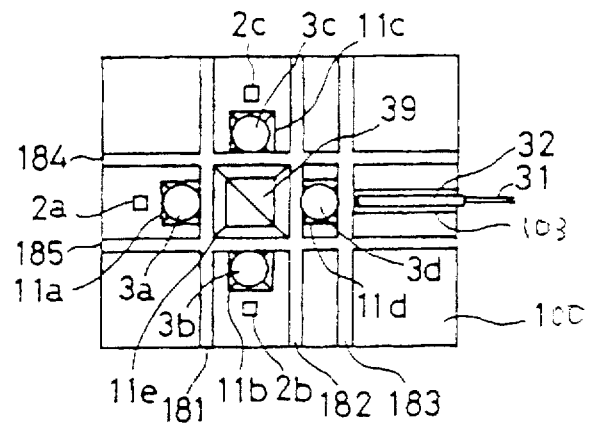
FIGS. 49A, 49B and 49C are diagrams of an optical device according to a twenty-second embodiment of the present invention.
Figure 49B:
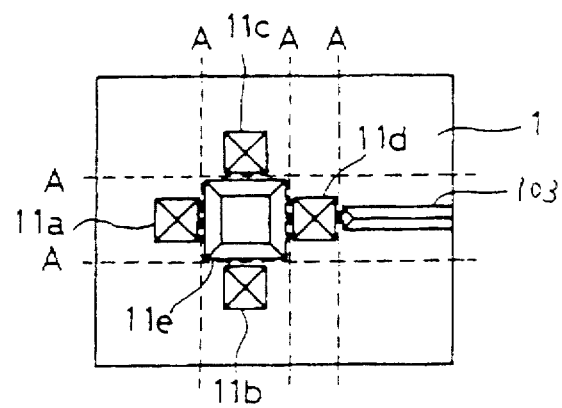
Figure 49C:
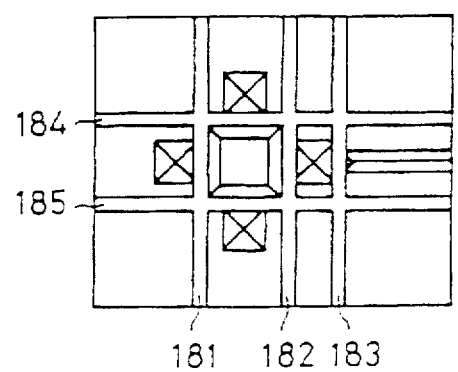

FIGS. 49A–49C show an optical device according to a twenty-second embodiment of the present invention, which is a variation of the embodiment thereof shown in FIG. 48. More particularly, FIG. 49A is a plan view of the optical device, and FIGS. 49B and 49C show steps of producing the carrier 1.

The optical device shown in FIGS. 49A–49C has a larger number of belt-shaped grooves 181, 182, 183, 184 and 185 than the optical device shown in FIG. 48. Further, the optical device shown in FIGS. 49A–49C has chips 2a, 2b and 2cincluding a semiconductor laser diode chip and a photodetector, lenses 3a, 3b3c and 3d, and the fiber ferrule 32. The carrier 100 has lens guide grooves 11a, 11b, 11c, 11d and 11e The carrier 100 can be produced as follows.

As shown in FIG. 49B, the guide grooves 11a, 11b, 11c, 11d, 11e and 103 are formed by anisotropically etching the (100) plane of the silicon carrier 1. Then, as shown in FIG. 49C, grooves are formed along lines A by the dicing saw so that the belt-shaped grooves 181, 182, 183, 184 and 185 are formed which are 200 μm wide and 100 μm deep. The closest distance between the grooves is equal to or less than 50 μm. The optical components are placed in the respective guide grooves.

It will be noted that the grooves are simultaneously formed by etching, so that the precision of positioning can be improved and the belt-shaped grooves 181–185 prevent the laser beam from being shaded.

The present invention is not limited to the specifically disclosed structures, and variations and modifications thereof may be made without departing from the present invention.

What is claimed is:

1. An optical device comprising:
   a common carrier comprising a silicon member having a main surface configured as a plane; and
   a first optical component and a second optical component that are supported by the common carrier, the first optical component being placed on the common carrier,
   the common carrier comprising on the main surface thereof:
   a first guide groove in which the second optical component which is a lens is positioned so that the second component is engaged with the first guide groove;
   a first beam passing groove extending from a vicinity of the first guide groove along an optical axis so that a light beam emitted from the first optical component travels in the beam passing groove; and
   a second groove which is connected to the first guide groove and the first beam passing groove and extends in a first direction perpendicular to the optical axis, the second groove allowing the light beam to travel at a position lower than the main surface of the common carrier without being shaded.

2. The optical device as claimed in claim 1, wherein:
   the first optical component is a semiconductor laser diode chip; and
   the first and second optical components are arranged so that optical axes thereof are aligned.

3. An optical device as claimed in claim 1, wherein:
   the first beam passing groove and the first guide groove are grooves formed by anistropic etching; and
   the second groove is a groove formed by a mechanical abrasion process.

4. The optical device comprising:
   a common carrier comprising a silicon member having a main surface configured as a plane; and
   a first optical component and a second optical component that are supported by the common carrier, the first optical component being placed on the common carrier,
   the common carrier comprising on the main surface thereof:
   a first guide groove in which the second optical component which is a lens is positioned so that the second component is engaged with the first guide groove;
   a first beam passing groove extending from a vicinity of the first guide groove along an optical axis so that a light beam emitted from the first optical component travels in the beam passing groove; and
   a second groove which is connected to the first guide groove and the first beam passing groove and extends in a first direction perpendicular to the optical axis, the second groove allowing the light beam to travel at a position lower than the main surface of the common carrier without being shaded;
   a second beam passing groove which is located between the first and second optical components, the light beam traveling in the second beam passing groove along the optical axis; and
   a third groove which is connected to the first guide groove and the second beam passing groove and extends in the first direction. the third groove allowing light beam to travel toward the second optical component at a position lower than the main surface of the common carrier without being shaded.

5. The optical device as claimed in claim 4. wherein:

the first and second beam passing grooves and the first guide grooves formed by anistropically etching the silicon carrier; and the second and third grooves are grooves formed by a mechanical abrasion process.

6. The optical device as claimed in claim 4. wherein:

the common carrier comprises a silicon carrier;

the first and second beam passing grooves and the first guide groove are grooves formed by anisotropically etching the silicon carrier; and the second and third grooves are grooves formed by a mechanical abrasion process.

* * * * *